(12) United States Patent
Li et al.

(10) Patent No.: US 11,990,725 B2
(45) Date of Patent: May 21, 2024

(54) OPTICAL MODULE

(71) Applicant: Hisense Broadband Multimedia Technologies Co., Ltd., Shandong (CN)

(72) Inventors: Dan Li, Shandong (CN); Mengbo Fu, Shandong (CN); Qinhao Fu, Shandong (CN); Yifan Xie, Shandong (CN); Tengfei Wang, Shandong (CN)

(73) Assignee: HISENSE BROADBAND MULTIMEDIA TECHNOLOGIES CO., LTD., Shandong (CN)

( * ) Notice: Subject to any disclaimer, the term of this patent is extended or adjusted under 35 U.S.C. 154(b) by 358 days.

(21) Appl. No.: 17/475,775

(22) Filed: Sep. 15, 2021

(65) Prior Publication Data

US 2022/0006253 A1 Jan. 6, 2022

Related U.S. Application Data

(63) Continuation-in-part of application No. PCT/CN2020/120922, filed on Oct. 14, 2020.

(30) Foreign Application Priority Data

May 22, 2020 (CN) .......................... 202010442741.0
May 22, 2020 (CN) .......................... 202010442745.9

(Continued)

(51) Int. Cl.
*H01S 3/04* (2006.01)
*G02B 6/42* (2006.01)
*H04B 10/50* (2013.01)

(52) U.S. Cl.
CPC .......... *H01S 3/0405* (2013.01); *G02B 6/4206* (2013.01); *G02B 6/4271* (2013.01); *G02B 6/428* (2013.01); *H04B 10/503* (2013.01)

(58) Field of Classification Search
CPC .... G02B 6/4206; G02B 6/4271; G02B 6/428; H01S 3/0405; H04B 10/503
(Continued)

(56) References Cited

U.S. PATENT DOCUMENTS

| 2015/0162990 | A1 | 6/2015 | Daiber et al. |
| 2019/0025528 | A1 | 1/2019 | Sun et al. |
| 2019/0346640 | A1* | 11/2019 | Xie ...................... G02B 6/4256 |

FOREIGN PATENT DOCUMENTS

| CN | 108646356 A | 10/2018 |
| CN | 108761668 A | 11/2018 |

(Continued)

OTHER PUBLICATIONS

International Search Report and Written Opinion issued in corresponding International Application No. PCT/CN2020/120922 dated Feb. 22, 2021, with English translation.

*Primary Examiner* — Jerry M Blevins
(74) *Attorney, Agent, or Firm* — Morgan, Lewis & Bockius LLP

(57) ABSTRACT

An optical module includes a shell, a circuit board and an optical transmitter device. The circuit board is disposed in the shell. The optical transmitter device is disposed in the shell, and includes a plate-shaped substrate and a laser assembly. The laser assembly is disposed on a surface of the substrate, is electrically connected to the circuit board, and is configured to emit an optical signal. The substrate is fixedly connected to an end of the circuit board.

19 Claims, 13 Drawing Sheets

(30) Foreign Application Priority Data

May 22, 2020 (CN) .......................... 202020885055.6
May 22, 2020 (CN) .......................... 202020885645.9

(58) Field of Classification Search
USPC .......................................................... 385/33
See application file for complete search history.

(56) References Cited

FOREIGN PATENT DOCUMENTS

| CN | 109283634 A | 1/2019 |
| --- | --- | --- |
| CN | 110376691 A | 10/2019 |
| CN | 110471147 A | 11/2019 |
| CN | 110764202 A | 2/2020 |
| CN | 110888208 A | 3/2020 |

\* cited by examiner

OPTICAL MODULE

CROSS-REFERENCE TO RELATED APPLICATIONS

This application is a continuation-in-part of International Application No. PCT/CN2020/120922 filed on Oct. 14, 2020, which claims priority to Chinese Application No. 202010442745.9, filed on May 22, 2020, Chinese Application No. 202020885055.6, filed on May 22, 2020, Chinese Application No. 202010442741.0, filed on May 22, 2020, and Chinese Application No. 202020885645.9, filed on May 22, 2020, which are incorporated herein by reference in their entireties.

TECHNICAL FIELD

The present disclosure relates to the field of optical communication technologies, and in particular, to an optical module.

BACKGROUND

Optical communication technologies are used in new services and application modes such as cloud computing, mobile Internet, and video conferencing. In the optical communication, an optical module is a tool for achieving interconversion between an optical signal and an electrical signal, and is one of key components in an optical communication device.

SUMMARY

An optical module is provided. The optical module includes a shell, a circuit board and an optical transmitter device. The circuit board is disposed in the shell. The optical transmitter device is disposed in the shell, and includes a plate-shaped substrate and a laser assembly. The laser assembly is disposed on a surface of the substrate, is electrically connected to the circuit board, and is configured to emit an optical signal. The substrate is fixedly connected to an end of the circuit board.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and actual timings of signals to which the embodiments of the present disclosure relate.

DETAILED DESCRIPTION

Figure 1:
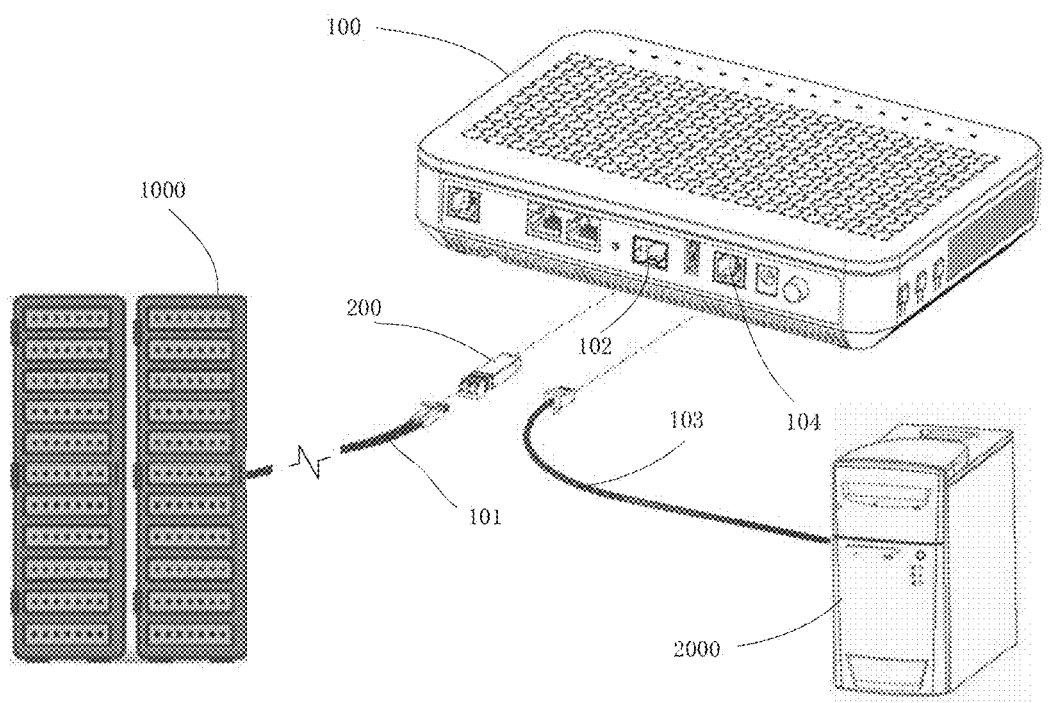
FIG. 1 is a diagram showing a connection relationship of an optical communication system, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to." In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, features defined as "first" and "second" may explicitly or implicitly include one or more of the features. In the description of the embodiments of the present disclosure, the term "a plurality of" means two or more unless otherwise specified.

In the description of some embodiments, the terms "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" herein means an open and inclusive language, which does not exclude devices that are applicable to or configured to perform additional tasks or steps.

The term "about", "substantially" and "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

In optical communication technology, an optical signal is used to carry information to be transmitted, and the optical signal carrying the information is transmitted to an information processing device such as a computer through an information transmission device such as an optical fiber or an optical waveguide to complete transmission of the information. Since the optical signal has a characteristic of passive transmission when being transmitted through the optical fiber or the optical waveguide, low-cost and low-loss information transmission may be achieved. In addition, a signal transmitted by the information transmission device such as the optical fiber or the optical waveguide is an optical signal, while a signal that can be recognized and processed by the information processing device such as the computer is an electrical signal. Therefore, in order to establish information connection between the information transmission device such as the optical fiber or the optical waveguide and the information processing device such as the computer, interconversion between the electrical signal and the optical signal needs to be achieved.

An optical module implements a function of interconversion between the optical signal and the electrical signal in the field of optical fiber communication technology. The optical module may be classified as an optical transmitter module, an optical receiver module and an optical transmitter-receiver module according to its functions. The optical transmitter module may generally be referred to as a transmitter optical sub-assembly (TOSA), and is configured to convert an electrical signal into an optical signal. The optical receiver module may generally be referred to as a receiver optical sub-assembly (ROSA), and is configured to convert an optical signal into an electrical signal. The optical transmitter-receiver module may generally be referred to as a bi-directional optical sub-assembly (BOSA), and is configured to convert an electrical signal into an optical signal and convert an optical signal into an electrical signal.

The optical module includes an optical port and an electrical port. Optical communication between the optical module and the information transmission device such as the optical fiber or the optical waveguide is achieved through the optical port. Electrical connection between the optical module and an optical network terminal (e.g., an optical modem) is achieved through the electrical port. The electrical connection is mainly to achieve power supply, transmission of an I2C signal, transmission of a data signal and grounding. The optical network terminal transmits the electrical signal to the information processing device such as the computer through a network cable or wireless fidelity (Wi-Fi).

FIG. 1 is a diagram showing a connection relationship of an optical communication system. As shown in FIG. 1, the optical communication system mainly includes a remote server 1000, a local information processing device 2000, an optical network terminal 100, an optical module 200, an optical fiber 101, and a network cable 103.

One terminal of the optical fiber 101 is connected to the remote server 1000, and the other terminal of the optical fiber 101 is connected to the optical network terminal 100 through the optical module 200. The optical fiber itself may support long-distance signal transmission, such as several-kilometer (6-kilometer to 8-kilometer) signal transmission. Based on this, if a repeater is used, infinite-distance transmission may be achieved theoretically. Therefore, in a typical optical communication system, a distance between the remote server 1000 and the optical network terminal 100 may typically reach several kilometers, tens of kilometers, or hundreds of kilometers.

One terminal of the network cable 103 is connected to the local information processing device 2000, and the other terminal of the network cable 103 is connected to the optical network terminal 100. The local information processing device 2000 is at least one of the followings: a router, a switch, a computer, a mobile phone, a tablet computer, or a television.

A physical distance between the remote server 1000 and the optical network terminal 100 is greater than a physical distance between the local information processing device 2000 and the optical network terminal 100. Connection between the local information processing device 2000 and the remote server 1000 is completed by the optical fiber 101 and the network cable 103; connection between the optical fiber 101 and the network cable 103 is completed by the optical module 200 and the optical network terminal 100.

The optical module 200 includes the optical port and the electrical port. The optical port is configured to be connected to the optical fiber 101, so that a bidirectional optical signal connection is established between the optical module 200 and the optical fiber 101. The electrical port is configured to access the optical network terminal 100, so that a bidirectional electrical signal connection is established between the optical module 200 and the optical network terminal 100. Interconversion between the optical signal and the electrical signal is achieved by the optical module 200, so that connection between the optical fiber 101 and the optical network terminal 100 is established. For example, an optical signal from the optical fiber 101 is converted into an electrical signal by the optical module 200, and then the electrical signal is input into the optical network terminal 100; an electrical signal from the optical network terminal 100 is converted into an optical signal by the optical module 200, and then the optical signal is input into the optical fiber 101. Since the optical module 200 is a tool for achieving the interconversion between the optical signal and the electrical signal, and has no function of processing data, information does not change in the above photoelectric conversion process.

The optical network terminal 100 includes a housing in a substantially cuboid shape, and an optical module interface 102 and a network cable interface 104 that are disposed on the housing. The optical module interface 102 is configured to access the optical module 200, so that the bidirectional electrical signal connection is established between the optical network terminal 100 and the optical module 200; the network cable interface 104 is configured to access the network cable 103, so that a bidirectional electrical signal connection is established between the optical network terminal 100 and the network cable 103. That is, connection is established between the optical module 200 and the network cable 103 through the optical network terminal 100. For example, the optical network terminal 100 transmits an electrical signal from the optical module 200 to the network cable 103, and transmits an electrical signal from the network cable 103 to the optical module 200. Therefore, the optical network terminal 100, as a master monitor of the optical module 200, may monitor operation of the optical module 200. In addition to the optical network terminal 100, the master monitor of the optical module 200 may further include an optical line terminal (OLT).

A bidirectional signal transmission channel is established between the remote server 1000 and the local information processing device 2000 through the optical fiber 101, the optical module 200, the optical network terminal 100, and the network cable 103.

Figure 2:
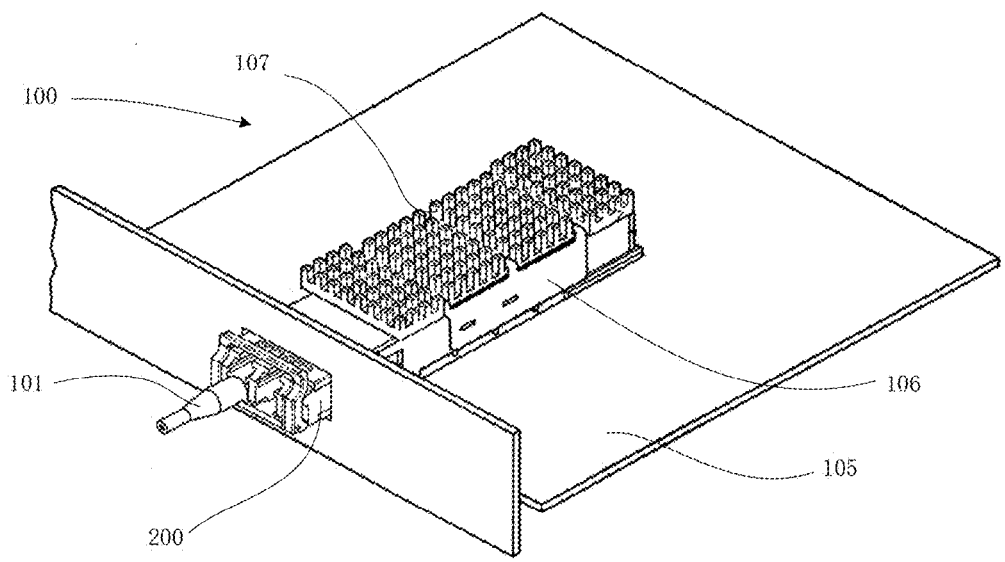
FIG. 2 is a diagram showing a structure of an optical network terminal, in accordance with some embodiments.

FIG. 2 is a diagram showing a structure of an optical network terminal. In order to clearly show a connection relationship between the optical module 200 and the optical network terminal 100, FIG. 2 only shows structures of the optical network terminal 100 related to the optical module 200. As shown in FIG. 2, the optical network terminal 100 further includes a circuit board 105 disposed in the housing, a cage 106 disposed on a surface of the circuit board 105, a heat sink 107 disposed on the cage 106, and an electrical connector disposed inside the cage 106. The electrical connector is configured to access the electrical port of the optical module 200; the heat sink 107 has protruding structures such as fins for increasing a heat dissipation area.

The optical module 200 is inserted into the cage 106 of the optical network terminal 100, the optical module 200 is fixed by the cage 106, and heat generated by the optical module 200 is conducted to the cage 106 and is dissipated through the heat sink 107. After the optical module 200 is inserted into the cage 106, the electrical port of the optical module 200 is connected to the electrical connector in the cage 106, so that the bidirectional electrical signal connection is established between the optical module 200 and the optical network terminal 100. In addition, the optical port of the optical module 200 is connected to the optical fiber 101, so that the bidirectional optical signal connection is established between the optical module 200 and the optical fiber 101.

Figure 3:
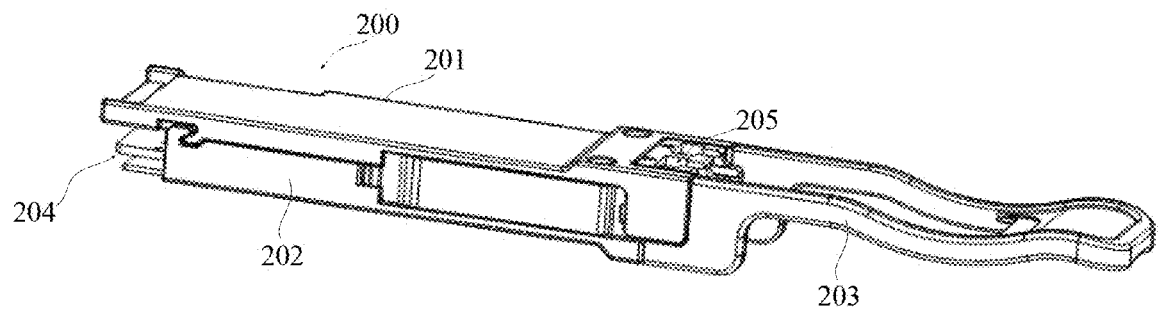
FIG. 3 is a diagram showing a structure of an optical module, in accordance with some embodiments.
Figure 4:
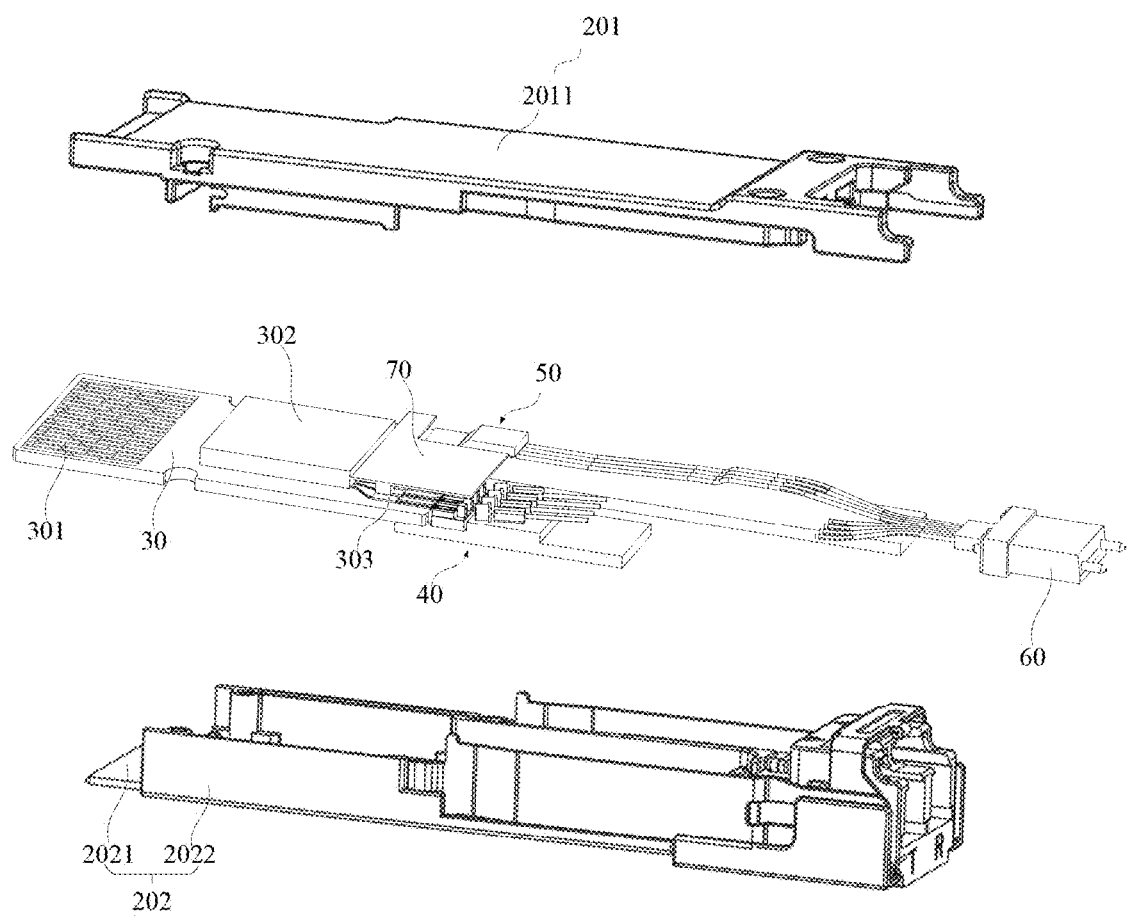
FIG. 4 is a diagram showing a disassembled structure of an optical module, in accordance with some embodiments.

FIG. 3 is a diagram showing a structure of an optical module 200, in accordance with some embodiments, and FIG. 4 is a diagram showing a disassembled structure of an optical module 200, in accordance with some embodiments. As shown in FIGS. 3 and 4, the optical module 200 includes a shell, a circuit board 30 disposed in the shell, an optical transmitter device 40 and an optical receiver device 50.

In some other embodiments, the optical module 200 includes one of the optical transmitter device 40 and the optical receiver device 50, instead of both of them. It will be noted that, in actual products, optical modules 200 generally each include both the optical transmitter device 40 and the optical receiver device 50, and only a few optical modules 200 each include only the optical transmitter device 40 or only the optical receiver device 50.

The shell includes an upper shell 201 and a lower shell 202. The upper shell 201 covers the lower shell 202 to form the shell with two openings 204 and 205; an outer contour of the shell is generally in a cuboid shape.

In some embodiments, the lower shell 202 includes a bottom plate 2021 and two lower side plates 2022 located on both sides of the bottom plate 2021 and disposed perpendicular to the bottom plate 2021; the upper shell 201 includes a cover plate 2011, and the cover plate 2011 covers the two lower side plates 2022 of the lower shell 202 to form the shell.

In some other embodiments, the lower shell 202 includes a bottom plate and two lower side plates located on both sides of the bottom plate and disposed perpendicular to the bottom plate; the upper shell 201 include a cover plate and two upper side plates located on both sides of the cover plate and disposed perpendicular to the cover plate, and the two upper side plates are combined with the two lower side plates, so that the upper shell 201 covers the lower shell 202.

A direction of a connecting line between the two openings 204 and 205 may be the same as a length direction of the optical module 200, or may not be the same as the length direction of the optical module 200. For example, the opening 204 is located at an end (a left end in FIG. 3) of the optical module 200, and the opening 205 is also located at an end (a right end in FIG. 3) of the optical module 200.

Alternatively, the opening 204 is located at an end of the optical module 200, and the opening 205 is located at a side of the optical module 200. The opening 204 is the electrical port, and a connecting finger 301 of the circuit board 30 extends from the electrical port 204, and is inserted into the master monitor (e.g., the optical network terminal 100); the opening 205 is the optical port, which is configured to access the external optical fiber 101, so that the optical fiber 101 is connected to the optical transmitter device 40 and the optical receiver device 50 inside the optical module 200.

By using an assembly mode of combining the upper shell 201 with the lower shell 202, it is possible to facilitate installation of the circuit board 30, the optical transmitter device 40, the optical receiver device 50 and other optical devices into the shell, and the upper shell 201 and the lower shell 202 may form encapsulation and protection for these devices. In addition, when the circuit board 30, the optical transmitter device 40, the optical receiver device 50 and other devices are assembled, it is possible to facilitate arrangement of positioning components, heat dissipation components, and electromagnetic shielding components of these devices, which is conducive to implementation of automated production.

In some embodiments, the upper shell 201 and the lower shell 202 are generally made of a metallic material, which facilitates electromagnetic shielding and heat dissipation.

In some embodiments, the optical module 200 further includes an unlocking component 203 located on an outer wall of the shell thereof, and the unlocking component 203 is configured to achieve or release a fixed connection between the optical module 200 and the master monitor.

For example, the unlocking component 203 is located on outer walls of the two lower side plates 2022 of the lower shell 202, and includes an engagement component that is matched with the cage of the master monitor (e.g., the cage 106 of the optical network terminal 100). When the optical module 200 is inserted into the cage of the master monitor, the optical module 200 is fixed in the cage of the master monitor by the engagement component of the unlocking component 203. When the unlocking component 203 is pulled, the engagement component of the unlocking component 203 moves therewith. Then, a connection relationship between the engagement component and the master monitor is changed to release engagement between the optical module 200 and the master monitor, so that the optical module 200 may be drawn out of the cage of the master monitor.

The circuit board 30 includes circuit wires, electronic elements, and chips. The electronic elements and the chips are connected together through the circuit wires according to a circuit design, so as to achieve functions of power supply, electrical signal transmission, and grounding. The electronic elements may include, for example, capacitors, resistors, triodes, and metal-oxide-semiconductor field-effect transistors (MOSFETs). The chips may include, for example, a microcontroller unit (MCU), a clock data recovery (CDR) chip, a power management chip, and a digital signal processing (DSP) chip.

The circuit board 30 is generally a rigid circuit board. The rigid circuit board may further achieve a load-bearing function due to its hard material. For example, the rigid circuit board may stably bear the electronic elements and the chips. The rigid circuit board may further be inserted into the electrical connector in the cage of the master monitor.

The circuit board 30 further includes a connecting finger 301 formed on a surface of an end thereof, and the connecting finger 301 is composed of a plurality of pins separate from each other. The circuit board 30 is inserted into the cage 106, and is conductively connected to the electrical connector in the cage 106 through the connecting finger 301. Herein, the connecting finger 301 may be disposed on only one surface (e.g., an upper surface shown in FIG. 5A) of the circuit board 30, or may be disposed on both upper and lower surfaces of the circuit board 30 to adapt to an occasion with a demand for a large number of pins. The connecting finger 301 is configured to establish electrical connection with the master monitor to achieve power supply, grounding, transmission of an I2C signal, transmission of a data signal, etc.

Of course, flexible circuit boards are further used in some optical modules. As a supplement to the rigid circuit board, a flexible circuit board is generally used in conjunction with the rigid circuit board. For example, the circuit board 30 may be connected to the optical transmitter device 40 and the optical receiver device 50 through flexible circuit boards instead of circuit wires.

As shown in FIG. 4, the optical transmitter device 40 is configured to convert an electrical signal into an optical signal, and the generated optical signal is transmitted to an outside of the optical module 200 through an optical fiber socket 60; the optical receiver device 50 is configured to convert an optical signal received by the optical fiber socket 60 into an electrical signal. In some embodiments, the optical receiver device 50 is disposed on the surface of the circuit board 30, and is electrically connected to the circuit board 30 by means of welding or wire bonding. Alternatively, the optical receiver device 50 is separated from the circuit board 30, and is electrically connected to the circuit board 30 through a flexible circuit board.

In the related art, the optical transmitter device usually adopts an encapsulation manner of a package. A design of the package is relatively complicated, and the package is usually manufactured through machining or by virtue of a mould, therefore a production cost of the package is high. In addition, when the optical transmitter device is encapsulated, components such as laser chips and lenses included therein need to be fixed in the package. However, since space inside the package of the optical transmitter device is very small, it does not facilitate production and operation.

Figure 5A:
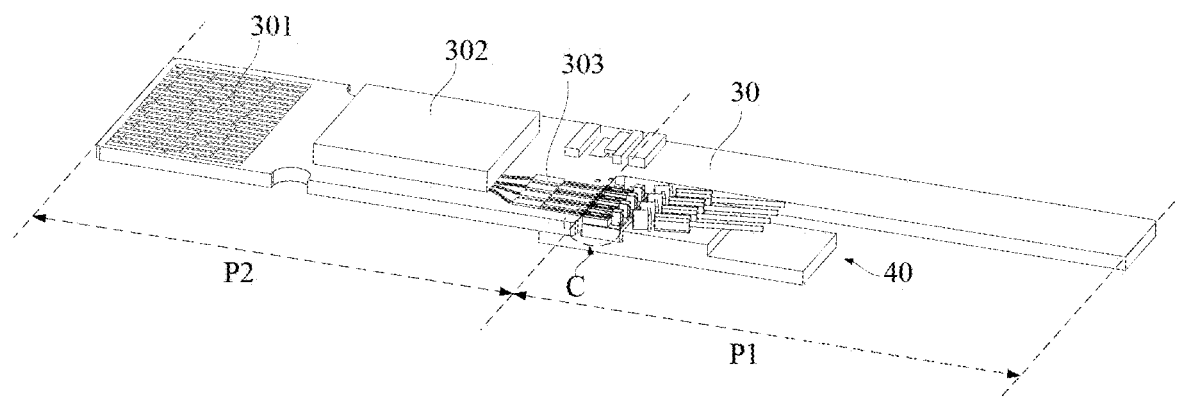
FIG. 5A is a diagram showing an assembly structure of an optical transmitter device and a circuit board, in accordance with some embodiments.
Figure 5B:
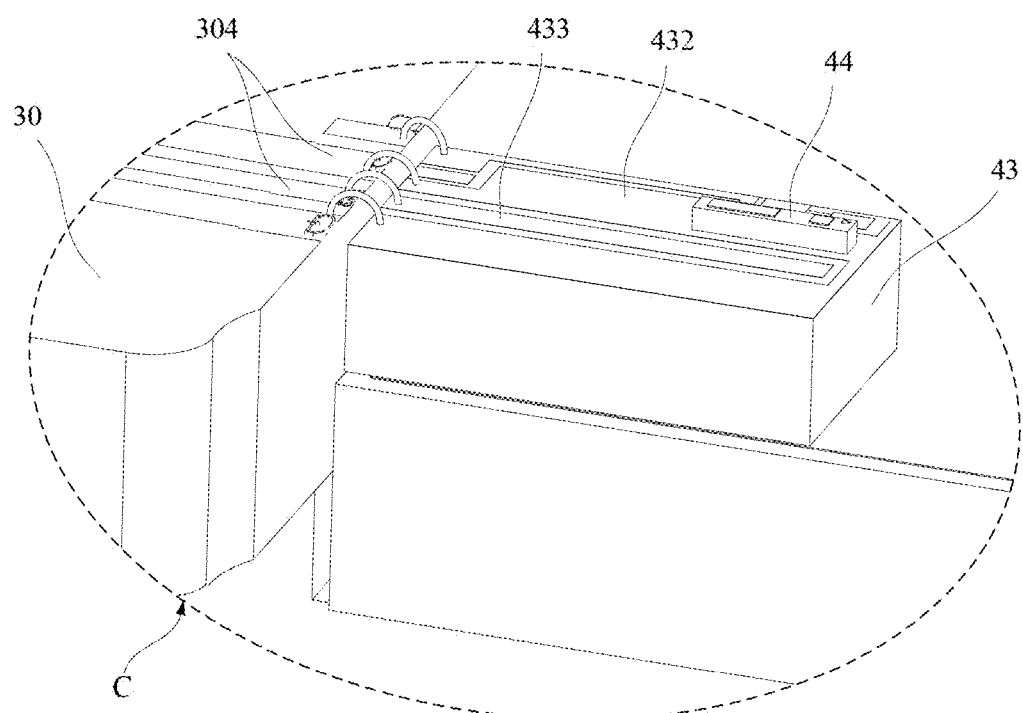
FIG. 5B is an enlarged view of the portion C in FIG. 5A.
Figure 6:
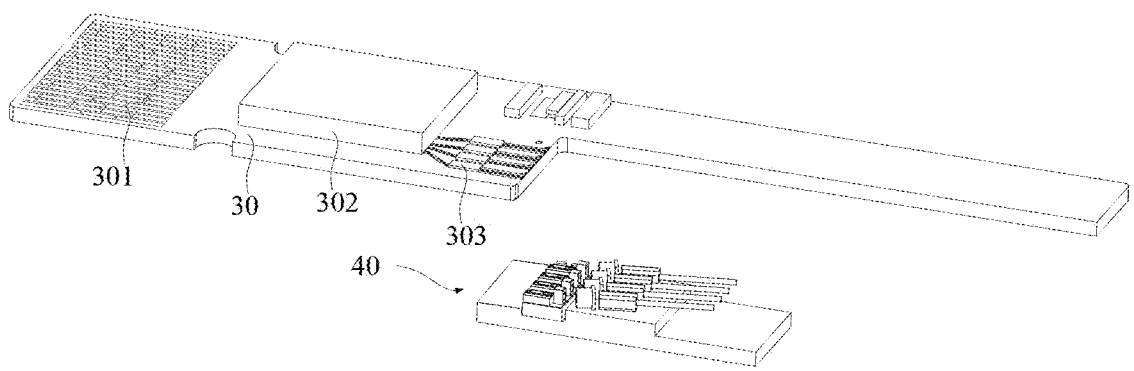
FIG. 6 is a diagram showing structures of an optical transmitter device and a circuit board that are in a disassembled state, in accordance with some embodiments.

FIG. 5A is a diagram showing an assembly structure of an optical transmitter device and a circuit board, in accordance with some embodiments. FIG. 5B is an enlarged view of the portion C in FIG. 5A. FIG. 6 is a diagram showing structures of an optical transmitter device and a circuit board that are in a disassembled state, in accordance with some embodiments. As shown in FIGS. 5A and 6, the optical transmitter device 40 provided by some embodiments of the present disclosure is encapsulated in a non-airtight manner. The optical transmitter device 40 is separated from the circuit board 30, and is electrically connected to the circuit board 30 through connecting lines made of a metallic material by using a wire bonding process. For example, the optical transmitter device 40 is electrically connected to the circuit board 30 through gold wires.

The circuit board 30 is in a shape of an elongated plate, and includes a first portion P1 and a second portion P2. The first portion P1 is a portion of the circuit board 30 matched with the optical transmitter device 40 and the optical receiver device 50, and the second portion P2 is a remaining portion of the circuit board 30. In some embodiments, a material at a position of the first portion P1 corresponding to the optical transmitter device 40 is removed to form a recess portion in which the optical transmitter device 40 is disposed. That is to say, in a case where the optical transmitter device 40 is located between the circuit board 30 and the lower shell 202, the optical transmitter device 40 is not blocked by the circuit board 30.

The optical module 200 is usually used indoors, with appropriate indoor temperature and humidity, high cleanliness, and little dust. For example, most buildings used as data centers have enclosed indoor spaces to prevent entry of dust, and air conditioners are used to control temperature and humidity of the indoor spaces. Therefore, an environment in which the optical module 200 is used generally does not require high air tightness. Based on this, and for consideration of cost, in the optical module in some embodiments of the present disclosure, the optical transmitter device 40 and the circuit board 30 are encapsulated in the non-airtight manner, and the package is omitted. In this way, not only requirements of the optical module 200 on the air tightness are met, but also the cost is reduced.

Figure 7:
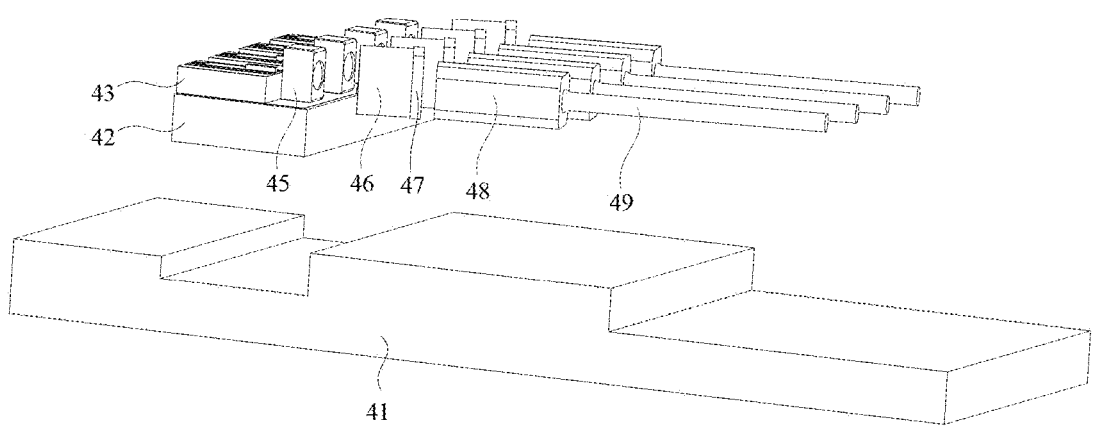
FIG. 7 is a diagram showing a disassembled structure of an optical transmitter device, in accordance with some embodiments.
Figure 8:
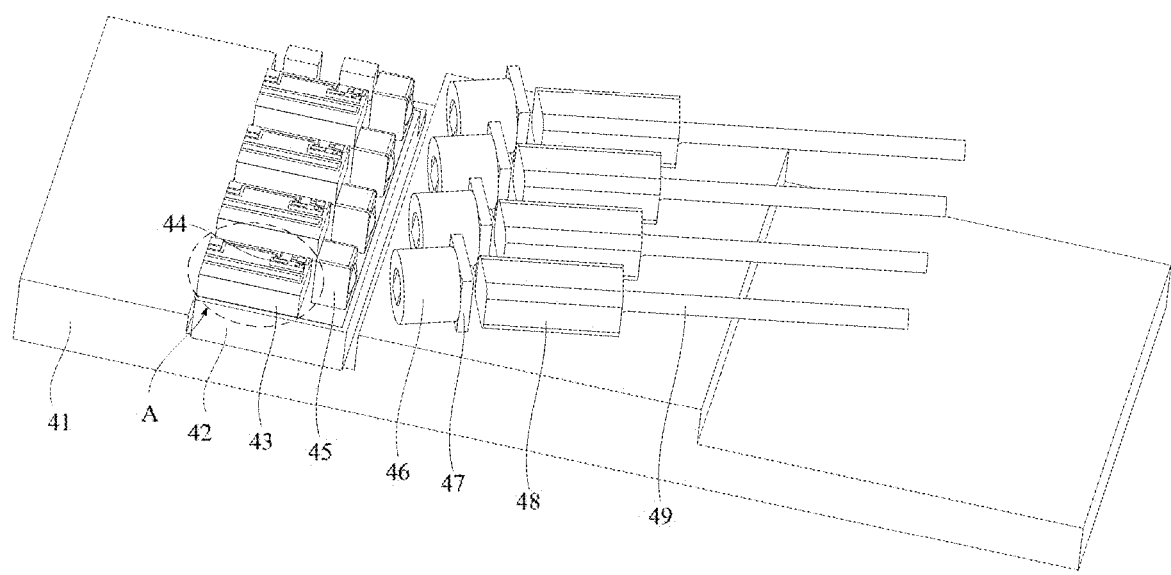
FIG. 8 is a diagram showing an assembly structure of an optical transmitter device, in accordance with some embodiments.

FIG. 7 is a diagram showing a disassembled structure of an optical transmitter device, in accordance with some embodiments. FIG. 8 is a diagram showing an assembly structure of an optical transmitter device, in accordance with some embodiments. As shown in FIGS. 7 and 8, the optical transmitter device 40 includes a substrate 41 and a plurality of laser assemblies disposed on a surface of the substrate 41. Each laser assembly includes a spacer 43 and a laser chip 44.

The present disclosure does not limit the number of the laser assemblies, which may be two, three or more, or one. It can be understood that, increasing the number of the laser assemblies may increase a data transmission rate. For example, as shown in FIG. 5A, the optical transmitter device 40 includes four laser assemblies.

Figure 9:
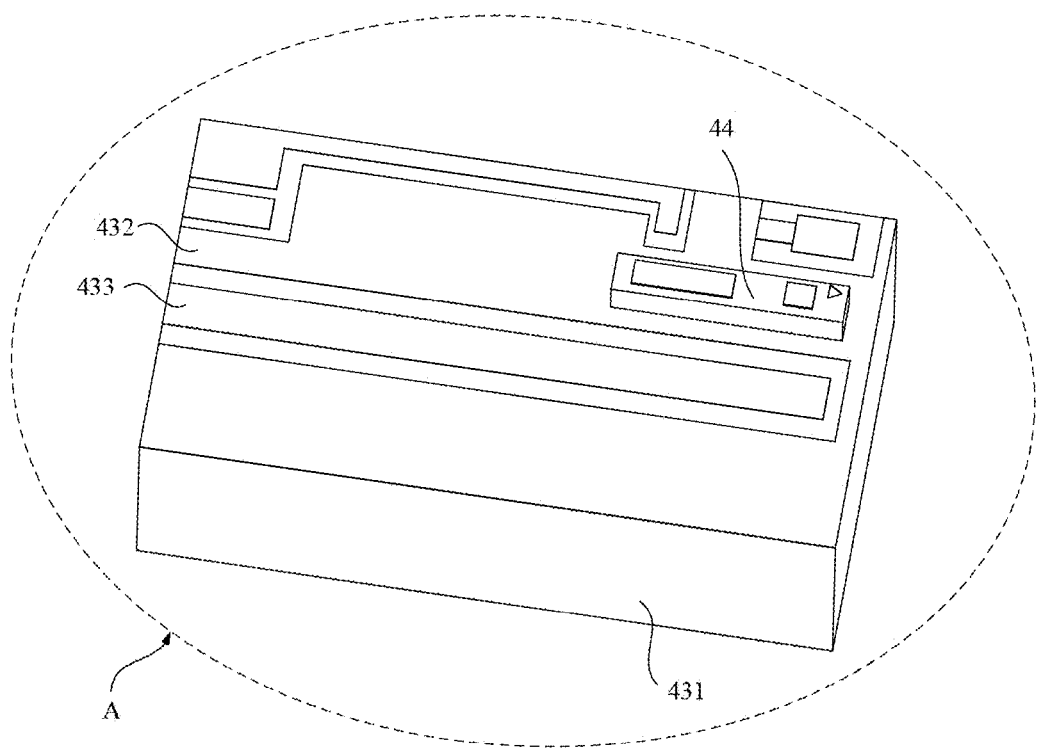
FIG. 9 is an enlarged view of a laser assembly in the region A shown in FIG. 8.

The spacer 43 is disposed on the substrate 41, and the laser chip 44 is disposed on a surface of the spacer 43 away from the substrate 41. As shown in FIG. 9, the spacer 43 includes an insulating heat conduction layer 431 in contact with the substrate 41. Heat generated by the laser chip 44 may be conducted to the substrate 41 through the insulating heat conduction layer 431, and then to the outside of the optical module 200 through the substrate 41.

In some embodiments, the insulating heat conduction layer 431 may be made of a ceramic material with a good thermal conductivity, a good insulation and a high processing accuracy, and of course, the material is not limited to ceramic.

A metalized circuit pattern (or referred to as a trace) is formed on a surface of the insulating heat conduction layer 431 away from the substrate 41, and the metalized circuit pattern includes a signal line 433 and a ground metal wire 432 that are insulated from each other. A cathode of the laser chip 44 may be fixedly connected to the ground metal wire 432 through welding or a conductive adhesive, so as to be electrically connected to the ground metal wire 432. An anode of the laser chip 44 may be electrically connected to the signal line 433 through wire bonding.

It will be noted that, shapes and layouts of the signal line 433 and the ground metal wire 432 are not limited to manners provided in some embodiments of the present disclosure, and may be designed according to requirements such as a signal transmission rate, and layouts of components. The substrate 41 serves as an optical platform to provide a flat bearing surface for the plurality of laser assemblies. In order to facilitate to dissipate heat of the components (e.g., the laser chips 44) provided on the surface of the substrate 41, a surface of the substrate 41 opposite to the surface where the plurality of laser assemblies are located may be fixed with the shell of the optical module 200, such as the lower shell 202, through a thermally conductive adhesive. In this way, heat generated by the components in the optical transmitter device 40 may be conducted to the shell of the optical module 200 through the substrate 41, and then to the outside of the optical module 200 through the shell of the optical module 200.

In some embodiments, considering factors such as a heat dissipation effect, a processing accuracy, and thermal expansion, the substrate 41 is made of tungsten copper, i.e., an alloy of tungsten and copper. Of course, in some other embodiments, the substrate 41 may further be made of other materials, such as ceramic.

In order to further improve a heat dissipation efficiency of the optical transmitter device 40, the optical transmitter device 40 further includes a thermoelectric cooler (TEC) 42. The TEC 42 is disposed on the surface of the substrate 41, and the plurality of laser assemblies are disposed on a surface of the TEC 42 away from the substrate 41. The TEC 42 is configured to conduct the heat generated by the laser chips 44 to the substrate 41, and then conduct the heat to the outside of the optical module 200 through the substrate 41 and the shell of the optical module 200. In some embodiments, the TEC 42 includes a first heat exchange surface and a second heat exchange surface that are disposed opposite to each other, and a plurality of heat conduction columns located between the first heat exchange surface and the second heat exchange surface. The first heat exchange surface and the second heat exchange surface are connected through the plurality of heat conduction columns. In some embodiments, the plurality of heat conduction columns may be arranged in an array, and may be made of a semiconductor material.

The plurality of laser assemblies are disposed on the first heat exchange surface, and the first heat exchange surface is configured to absorb the heat generated by the laser chips 44 and conducted by the spacers 43. The heat conduction columns are configured to conduct heat of the first heat exchange surface to the second heat exchange surface. The second heat exchange surface is fixed on the surface of the substrate 41. Therefore, heat of the second heat exchange surface of the TEC 42 may be conducted to the outside of the optical module 200 by using the substrate 41.

During operation of the optical module 200, high-frequency electrical signals from the master monitor (e.g., the optical network terminal 100) are transmitted to the chips disposed on the circuit board 30 such as the CDR chip 302 and the laser driver chips 303 through the connecting finger 301 on the circuit board 30. The chips such as the CDR chip 302 and the laser driver chips 303 respectively perform processing such as signal shaping and amplitude adjustment on the high-frequency electrical signals received by the optical module 200, so as to obtain modulation signals capable of modulating light into optical signals. Then, the modulation signals are transmitted to the laser chips 44 disposed on the spacers 43, so that the laser chips 44 emit optical signals based on the modulation signals.

The circuit board 30 includes a first surface and a second surface that are disposed opposite to each other. In addition to the chips such as the CDR chip 302 and the laser driver chips 303, the first surface of the circuit board 30 is further provided with ground metal wires and signal lines (collectively shown as 304 in FIG. 5B). A signal line on the circuit board 30 is connected to the signal line 433 on the spacer 43 through wire bonding, and a ground metal wire on the circuit board 30 is connected to the ground metal wire 432 on the spacer 43 through wire bonding, so that the modulation signals from the circuit board 30 may be transmitted to the laser chips 44. It will be noted that, the spacer 43 may further be provided with components such as a backlight detector, a resistor and a capacitor, and each component may be electrically connected to the circuit board 30 through a corresponding wire disposed on the spacer 43 to achieve stable light emission of the laser chip 44.

Figure 10:
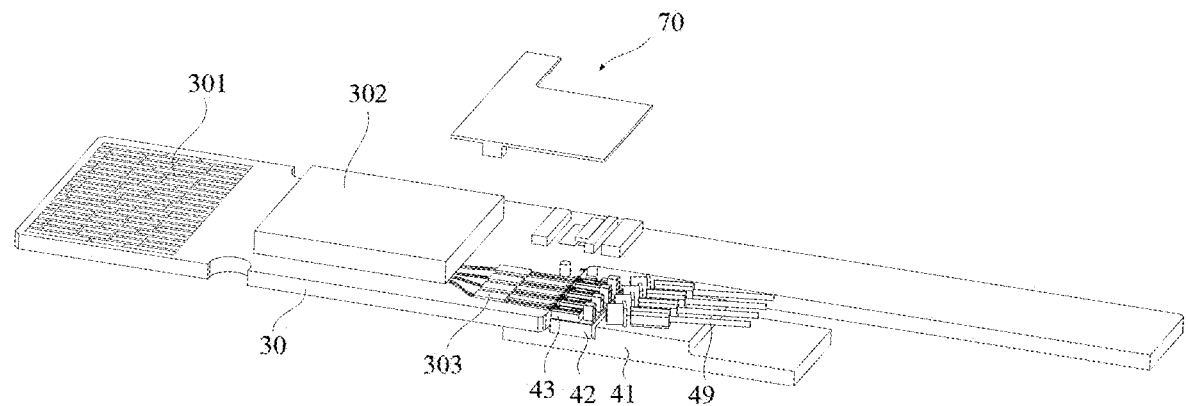
FIG. 10 is a diagram showing structures of a wire bonding protection component and a circuit board that are in a disassembled state, in accordance with some embodiments.

FIG. 10 is a diagram showing structures of a wire bonding protection component and a circuit board that are in a disassembled state, in accordance with some embodiments. As shown in FIG. 10, since a diameter of a connecting line used when the circuit board 30 and the spacer 43 are connected through the wire bonding is usually small, in order to prevent the connecting line from being broken due to changes in relative positions of the circuit board 30 and the spacer 43, there is a need to ensure stability of the relative positions of the circuit board 30 and the spacer 43. Moreover, considering impedance matching and other issues, a length of the connecting line connecting the signal line on the circuit board 30 and the signal line on the spacer 43 needs to be appropriate. Therefore, the substrate 41 is fixedly connected to an end of the second portion P2 of the circuit board 30.

Figure 11:
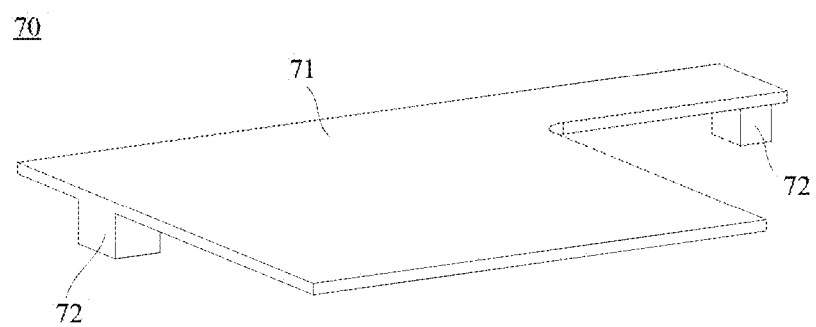
FIG. 11 is a diagram showing a structure of a wire bonding protection component, in accordance with some embodiments.

FIG. 11 is a diagram showing a structure of a wire bonding protection component, in accordance with some embodiments. In some embodiments, as shown in FIGS. 10 and 11, in order to prevent the connecting line connecting the circuit board 30 and the spacer 43 from being touched, the optical module 200 further includes the wire bonding protection component 70. The wire bonding protection component 70 is disposed on a surface of the circuit board 30 away from the substrate 41, and is located at an end of the second portion P2 of the circuit board 30 close to the spacer 43, so that the connecting line connecting the spacer 43 and the circuit board 30 is covered by the wire bonding protection component 70, thereby preventing the connecting line from collapsing and being damaged due to being touched.

In some embodiments, in order to prevent the wire bonding protection component 70 from conducting electricity, it may be made of a non-metallic material, such as a plastic material, and may be fixed on the circuit board 30 with a non-conductive adhesive.

In some embodiments, in order to facilitate to dissipate heat of devices under the wire bonding protection component 70 and reduce a footprint of the wire bonding protection component 70 on the circuit board 30, as shown in FIG. 11, the wire bonding protection component 70 includes a protection plate 71 and two or more supports 72. The protection plate 71 has a flat plate-like structure, and its specific shape may be set according to layout requirements of the circuit board 30. For example, the wire bonding protection component 70 is designed as an L-shaped structure. One end of a support 72 is fixedly connected to the protection plate 71, and the other end is fixed on the surface of the circuit board 30 away from the substrate 41 through the non-conductive adhesive.

Figure 12:
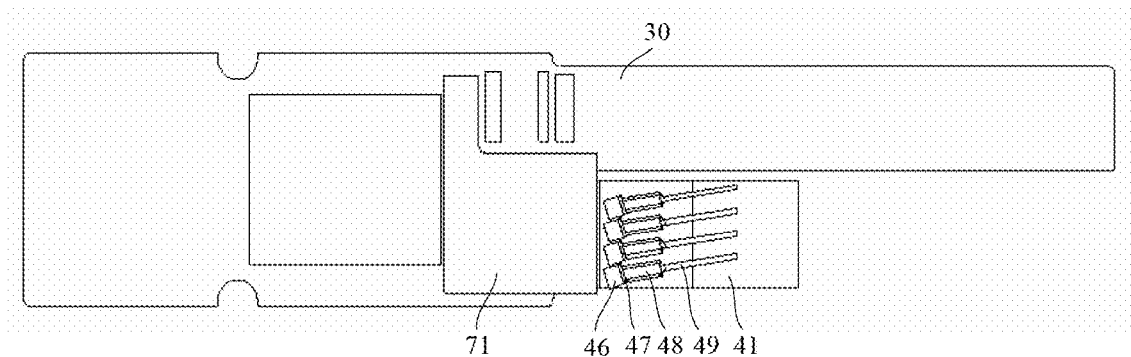
FIG. 12 is a top view of a wire bonding protection component and a circuit board, in accordance with some embodiments.

FIG. 12 is a top view of a circuit board and an optical transmitter device, in accordance with some embodiments. As shown in FIG. 12, since the laser chip 44 and the spacer 43 are also connected through wire bonding, in addition to arranging the connecting line connecting the circuit board 30 and the spacer 43 under the wire bonding protection component 70, the spacer 43 is also disposed under the wire bonding protection component 70. In addition, before the high-frequency electrical signals and other signals received by the laser chips 44 are transmitted to the laser chips 44, the processing such as the amplitude adjustment needs to be performed on these signals by the laser driver chips 303 disposed on the circuit board 30, and generally, the laser driver chips 303 are also electrically connected to the circuit board 30 through wire bonding. Therefore, the laser driver chips 303 are disposed on a first surface of the end of the circuit board 30 close to the spacers 43, and are disposed under the wire bonding protection component 70.

In some embodiments of the present disclosure, the substrate 41 with a simple structure is used to replace the package of the optical transmitter device in the related art, so that a material cost of the optical transmitter device is effectively reduced. In addition, an open structure is above the substrate 41, which may solve a problem of difficult encapsulation caused by the small space in the package. In addition, the non-airtight assembly manner of the substrate 41 and the circuit board 30 may also effectively ensure performance of the optical module 200 during use.

The optical transmitter device 40 further includes a plurality of optical fiber adapters 48 in one-to-one correspondence with the plurality of laser assemblies. In a case where the optical transmitter device 40 includes only one laser assembly, it may also include only one optical fiber adapter 48. For example, as shown in FIGS. 7 and 8, the optical transmitter device 40 includes four optical fiber adapters 48.

The optical fiber adapters 48 are disposed on the substrate 41, and are each located in a light exit direction of a laser chip 44, and are each configured to fix an internal optical fiber 49 connected to the optical fiber socket 60. The optical signal emitted by the laser chip 44 is transmitted to the internal optical fiber 49 connected to the optical fiber adapter 48, and then is transmitted to the outside of the optical module 200 through the optical fiber socket 60.

It will be noted that, the light exit direction of the laser chip 44 refers to a direction of an optical axis of a light beam carrying information emitted by the laser chip 44, and the optical axis is a center line of the light beam emitted by the laser chip 44.

Figure 13:
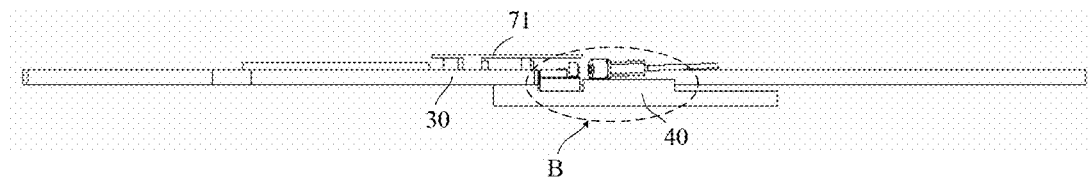
FIG. 13 is a side view of a circuit board and an optical transmitter device, in accordance with some embodiments.
Figure 14:
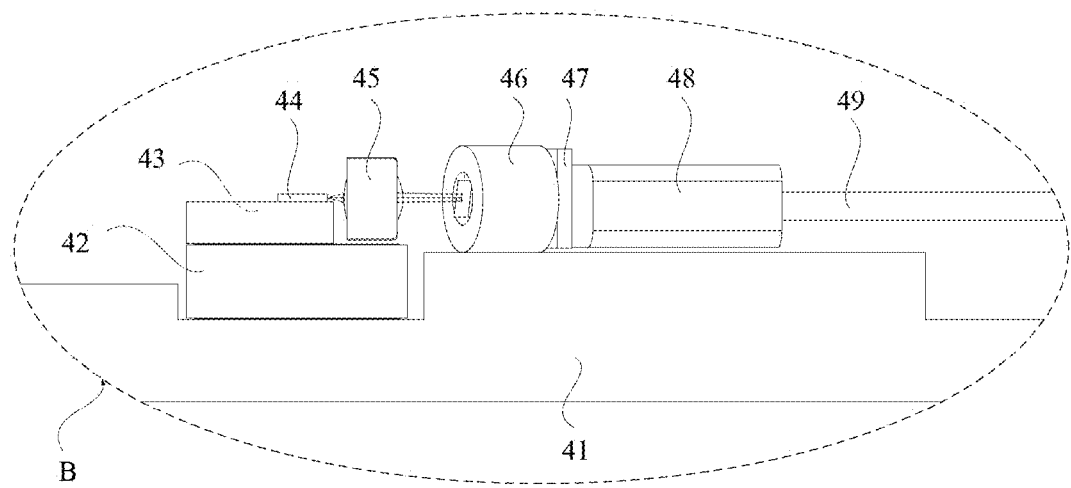
FIG. 14 is an enlarged view of the portion B in FIG. 13.

FIG. 13 is a side view of a circuit board and an optical transmitter device, in accordance with some embodiments. FIG. 14 is an enlarged view of the portion B in FIG. 13. As shown in FIGS. 13 and 14, the light emitted by the laser chip 44 is divergent light, and a light entry aperture of the internal optical fiber 49 is generally small. Therefore, in order to improve an optical coupling efficiency, the optical transmitter device 40 further includes a plurality of focusing lenses 45 in one-to-one correspondence with the plurality of laser assemblies. The focusing lenses 45 are disposed on the substrate 41, and are each located between a laser chip 44 and an optical fiber adapter 48, and are each configured to converge light emitted by the laser chip 44, so that the light is subsequently coupled with an internal optical fiber 49 in the optical fiber adapter 48. A light incident surface of the focusing lens 45 is disposed to face a light exit surface of the laser chip 44, and a light exit surface of the focusing lens 45 is disposed to face a light incident surface of an optical fiber adapter 48. The light emitted by the laser chip 44 is coupled into the internal optical fiber 49 in the optical fiber adapter 48 by using the focusing lens 45.

Since the light entry aperture of the internal optical fiber 49 is generally small. Therefore, in order to ensure the optical coupling efficiency, a position of the focusing lens 45 is adjusted, so that a focus of the focusing lens 45 is located near a light incident surface of the internal optical fiber 49 in the optical fiber adapter 48.

In addition, in order to keep the direction of the optical axis direction unchanged before and after the light is converged, the light emitted by the laser chip 44 needs to be incident along a center of the focusing lens 45. This incident direction may ensure that a spot distribution of the converged light is retained before the convergence to a greatest extent. For example, the light before and after the convergence each presents a regular circular light spot, thereby facilitating to improve efficiency of the subsequent coupling process. Therefore, in order to achieve alignment between the laser chip 44 and the focusing lens 45, and to ensure that a center of the light beam emitted by the laser chip 44 passes through an optical axis of the focusing lens 45, the focusing lens 45 is disposed on the surface of the TEC 42 away from the substrate 41, that is, a height difference between the laser chip 44 and the focusing lens 45 is compensated by using a spacer 43.

The optical fiber adapter 48 is fixed on the substrate 41, so that stability of relative positions of the focusing lens 45 and the optical fiber adapter 48 may be ensured, and in turn, stability of the optical coupling efficiency may be improved. Moreover, in order to allow more light emitted by the focusing lens 45 to enter the internal optical fiber 49 in the optical fiber adapter 48, the optical axis of the focusing lens 45 is in a same horizontal plane or approximately in the same horizontal plane as an optical axis of the optical fiber adapter 48.

Figure 15:
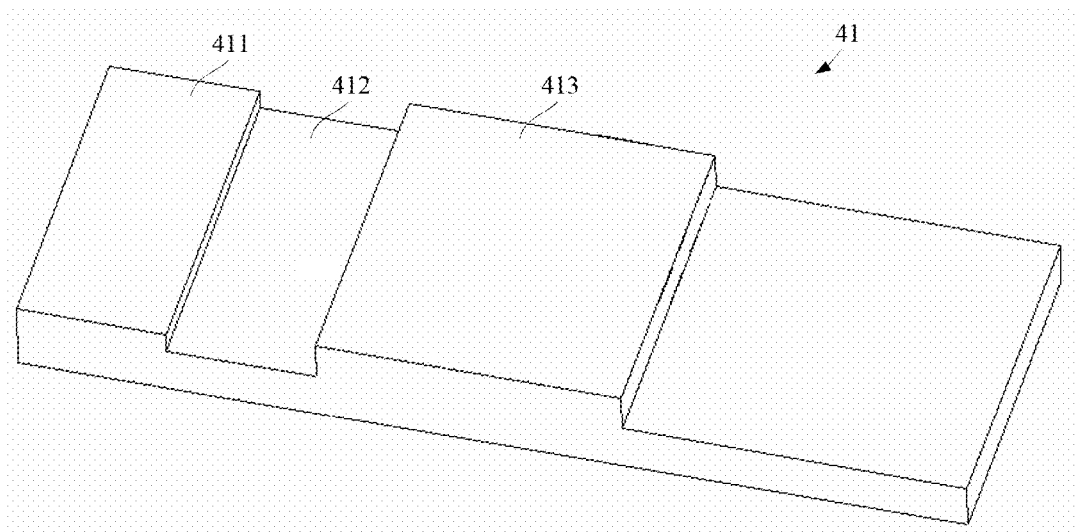
FIG. 15 is a diagram showing a structure of a substrate, in accordance with some embodiments.

FIG. 15 is a diagram showing a structure of a substrate, in accordance with some embodiments. As shown in FIG. 15, in order to achieve the alignment between the focusing lens 45 and the optical fiber adapter 48, the substrate 41 includes a recess 412 located in a middle region thereof, so that the surface of the substrate 41 is divided by the recess 412 into a first surface 411 and a second surface 413. The first surface 411 and the second surface 413 are located on both sides of the recess 412.

The first surface 411 is configured to be fixedly connected to a second surface of the end of the second portion P2 of the circuit board 30; the second surface 413 is configured to arrange the optical fiber adapters 48; the recess 412 is configured to arrange the TEC 42. The TEC 42 is in contact with a bottom of the recess 412, and the surface of the TEC 42 away from the substrate 41 is provided with the spacers 43 and the focusing lenses 45. A surface of a spacer 43 away from the TEC 42 is provided with a laser chip 44, so that the surface of the spacer 43 away from the TEC 42 is in a same horizontal plane or approximately in the same horizontal plane as the first surface of the circuit board 30, thereby facilitating wire bonding. In addition, the optical axis of the optical fiber adapter 48 may also be made in the same horizontal plane or approximately in the same horizontal plane as the optical axis of the focusing lens 45, so as to improve the optical coupling efficiency.

In some embodiments of the present disclosure, by making the substrate 41 include the recess 412, not only a bearing function of the substrate 41 is achieved, but also the alignment between the devices is effectively achieved. Compared with a substrate 41 with a flat surface, the encapsulation is more convenient, and raw materials for adjusting heights of the various devices may be effectively saved.

As shown in FIG. 14, in order to isolate reflected light in an optical path between the laser chip 44 and the optical fiber adapter 48, the optical transmitter device 40 further includes a plurality of isolators 46 in one-to-one correspondence with the plurality of laser assemblies. The isolators 46 are disposed on the second surface 413 of the substrate 41, and are each located between a focusing lens 45 and an optical fiber adapter 48, and are each configured to prevent light emitted by a laser chip 44 from being reflected back to the laser chip 44.

In some embodiments of the present disclosure, based on a polarization principle of light, the isolator 46 only allows the light to pass in a single direction, so as to isolate light reflected by the optical fiber adapter 48. Light whose polarization direction is parallel to a polarization direction of the isolator 46 may pass through the isolator 46, and light whose polarization direction is perpendicular to the polarization direction of the isolator 46 is absorbed by the isolator 46. For example, the isolator 46 allows the light emitted by the laser chip 44 to pass, but does not allow the light reflected by the optical fiber adapter 48 to pass. Based on an operation principle of the isolator 46, by setting an included angle between a polarization direction of the light emitted by the laser chip 44 and the polarization direction of the isolator 46, an efficiency at which the laser chip 44 is coupled with the isolator 46 may be adjusted, and in turn, a power of outputting light by the optical module 200 may be controlled.

In addition, for an optical module with a high speed such as a signal transmission rate of 400 Gb/s, it places higher requirements on the optical coupling efficiency. When the light enters the internal optical fiber 49 from air, approximately 4% of the light is reflected by the light incident surface of the internal optical fiber 49, which causes a loss of the optical coupling efficiency. Therefore, the optical module 200 further includes anti-reflection sheets 47 each disposed between an isolator 46 and an optical fiber adapter 48, so that air may be prevented from existing between the isolator 46 and the optical fiber adapter 48, and in turn, light reflection at the light incident surface of the optical fiber adapter 48 may be effectively reduced.

Figure 16:
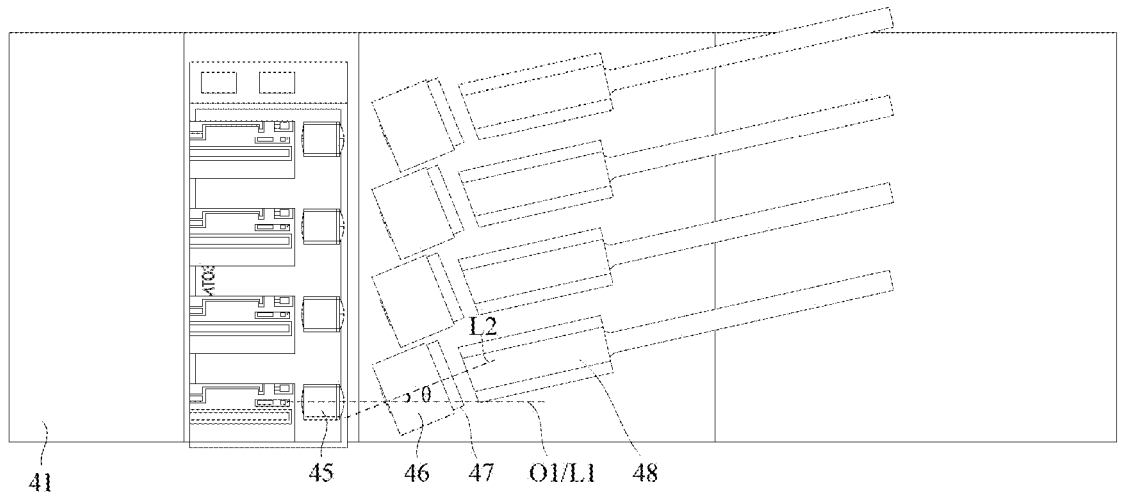
FIG. 16 is a top view of an optical transmitter device, in accordance with some embodiments.

The light emitted by the laser chip 44 may also be reflected by a light incident surface of the isolator 46, in addition to being reflected by the light incident surface of the optical fiber adapter 48 (this reflected light may be blocked by the isolator 46, and then is difficult to return along an original optical path). If the light emitted by the laser chip 44 is vertically incident on the light incident surface of the isolator 46, light reflected by the isolator 46 will return to the laser chip 44 along the original optical path, thereby affecting the light emission of the laser chip 44. As shown in FIG. 16, in order to prevent the light reflected by the isolator 46 from returning to the laser chip 44 and to reduce a return loss (a reflection loss), there is an included angle θ between a normal line L2 of the light incident surface of the isolator 46 and the light exit direction O1 of the laser chip 44, and a value of the included angle θ may be set as required, which may be set to, for example, 5°, 7°, 8°, or 10°. It will be noted that, the light exit direction O1 of the laser chip 44 may substantially coincide with or may not coincide with the optical axis L1 of the focusing lens 45. In a case where the light exit direction O1 of the laser chip 44 substantially coincides with the optical axis L1 of the focusing lens 45, the included angle θ between the normal line L2 of the light incident surface of the isolator 46 and the light exit direction O1 of the laser chip 44 is an included angle between the normal line L2 of the light incident surface of the isolator 46 and the optical axis L1 of the focusing lens 45.

The following will be described by taking an example in which the optical axis L1 of the focusing lens 45 coincides with the light exit direction O1 of the laser chip 44.

The light emitted by the laser chip 44 passes through the focusing lens 45, the isolator 46, and the anti-reflection sheet 47 in sequence, and then enters the internal optical fiber 49 in the optical fiber adapter 48. A light incident direction is perpendicular to an end face of the internal optical fiber 49. Although in this way, it is easy to control an angular relationship between the light exit direction of the laser chip 44 and the end face of the internal optical fiber 49, a vertical incidence may cause both the light reflected by the optical fiber adapter 48 and the light reflected by the isolator 46 to return to the laser chip 44 along the original optical path, which affects the light emission of the laser chip 44.

Therefore, in order to prevent the reflected light from returning along the original optical path, the optical path is designed such that the light is not vertically incident on the end face of the internal optical fiber 49, that is, there is an included angle between the light incident direction and a normal line of the end face of the internal optical fiber 49. In addition, in order to make the included angle θ exist between the normal line L2 of the light incident surface of the isolator 46 and the optical axis L1 of the focusing lens 45 without changing a structure of the isolator 46, in some embodiments of the present disclosure, the light incident surface of the optical fiber adapter 48 is set as an inclined surface.

Figure 17:
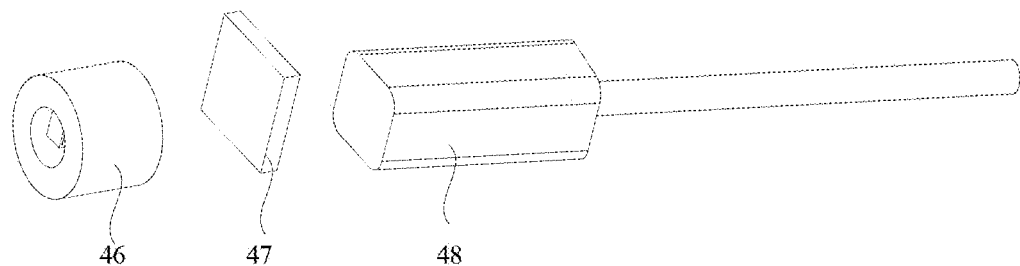
FIG. 17 is a diagram showing structures of an isolator, an anti-reflection sheet, and an optical fiber adapter that are in a disassembled state, in accordance with some embodiments.
Figure 18:
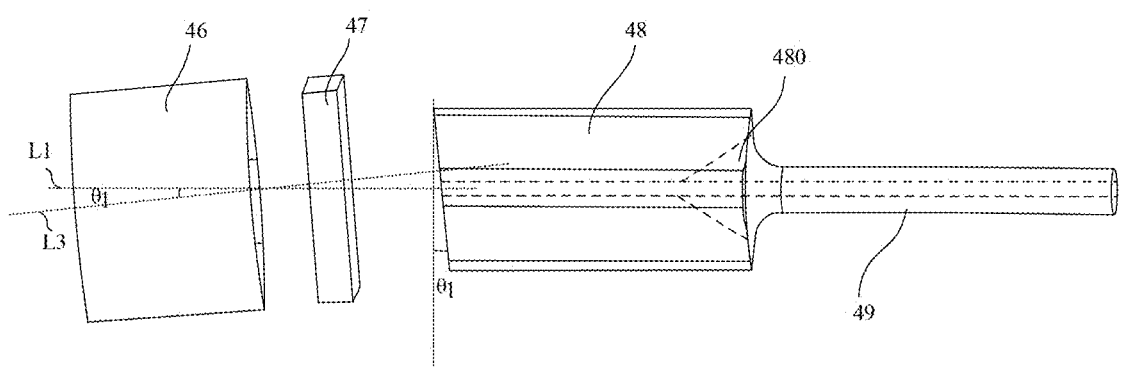
FIG. 18 is a diagram showing other structures of an isolator, an anti-reflection sheet, and an optical fiber adapter that are in a disassembled state, in accordance with some embodiments.

FIG. 17 is a diagram showing structures of an isolator, an anti-reflection sheet, and an optical fiber adapter that are in a disassembled state, in accordance with some embodiments. FIG. 18 is a diagram showing other structures of an isolator, an anti-reflection sheet, and an optical fiber adapter that are in a disassembled state, in accordance with some embodiments. As shown in FIGS. 17 and 18, based on the design that there is an included angle between the normal line L2 of the light incident surface of the isolator 46 and the optical axis L1 of the focusing lens 45, and the light incident surface of the optical fiber adapter 48 is an inclined surface, in order to facilitate to fix the isolator 46, the anti-reflection sheet 47 and the optical fiber adapter 48 on the substrate 41, the isolator 46, the anti-reflection sheet 47 and the optical fiber adapter 48 may be fixed together by means of bonding with an adhesive or bonding with a silver adhesive. The anti-reflection sheet 47 is fixed on the light incident surface of the optical fiber adapter 48, and then the isolator 46 is fixed on the anti-reflection sheet 47. When the optical module is encapsulated, the spacer 43, the laser chip 44 and the focusing lens 45 may be mounted in a passive mounting manner. The passive mounting means that in a state where the laser chip 44 is not energized and does not emit light, the spacer 43, the laser chip 44 and the focusing lens 45 are mounted. Then, an optical assembly composed of the isolator 46, the anti-reflection sheet 47 and the optical fiber adapter 48 is actively coupled. The active coupling means that in a state where the laser chip 44 is energized and emits light, the isolator 46 the anti-reflection sheet 47 and the optical fiber adapter 48 are mounted to ensure the coupling efficiency.

As shown in FIG. 18, the light incident surface of the optical fiber adapter 48 has a first inclination angle θ1 with respect to a plane perpendicular to an axis of the optical fiber adapter 48, and the end face of the internal optical fiber 49 also has a first inclination angle θ1 (an end of the internal optical fiber 49 being inserted into the optical fiber adapter 48). It can be understood that, the first inclination angle θ1 is equal to an included angle between a normal line L3 of the light incident surface of the optical fiber adapter 48 and the optical axis L1 of the focusing lens 45.

After the isolator 46 and the optical fiber adapter 48 are mounted together, the light incident surface of the isolator 46 also has a first inclination angle θ1. It can be understood that, the first inclination angle θ1 is equal to the included angle θ between the normal line L2 of the light incident surface of the isolator 46 and the optical axis L1 of the focusing lens 45. θ1 may be, for example, 5°, 7°, 8°, or 10°, but is not limited to this value.

In addition, as shown in FIG. 18, a port 480 for insertion of the internal optical fiber 49 in the optical fiber adapter 48 is provided to have a tapered structure. During encapsulation, the internal optical fiber 49 is inserted into the optical fiber adapter 48 through the port 480, and then an adhesive is poured into the tapered port 480, which facilitates fixation of the internal optical fiber 49.

After the light incident surface of the optical fiber adapter 48 has a certain inclination angle, light beams converged by the focusing lens 45, especially light beams close to the optical axis, are incident on the light incident surface of the internal optical fiber 49 in a non-vertical direction. The light is refracted at the light incident surface of the internal optical fiber 49 and then enters the internal optical fiber 49. An optical axis of the refracted light changes with respect to an optical axis of the light before the refraction. That is, there is an included angle between the optical axis of the refracted light and an axis of the internal optical fiber 49, which causes a decrease in the optical coupling efficiency. For this reason, in some embodiments of the present disclosure, a placement position of the optical fiber adapter 48 on the substrate 41 is optimized. The optical fiber adapter 48 is obliquely disposed on the substrate 41, so that the axis of the internal optical fiber 49 in the optical fiber adapter 48 is in a plane that is parallel or approximately parallel to the second surface 413 of the substrate 41, and is not parallel to the optical axis L1 of the focusing lens 45.

Figure 19:
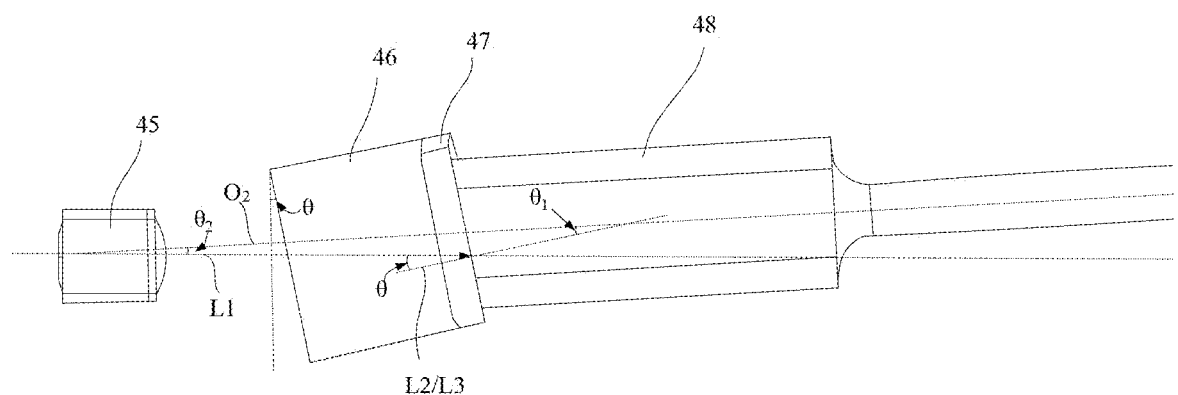
FIG. 19 is a diagram showing a structure of a focusing lens and an optical fiber adapter, in accordance with some embodiments.

FIG. 19 is a diagram showing a structure of a focusing lens and an optical fiber adapter, in accordance with some embodiments. As shown in FIG. 19, with respect to the optical axis L1 of the focusing lens 45, an axis O2 of the optical fiber adapter 48 has a second inclination angle θ2, which may be, for example, 3° or 2°, but is not limited to this value. In this case, the included angle θ between the normal line L2 of the light incident surface of the isolator 46 and the optical axis L1 of the focusing lens 45 increases from θ1 to a sum of θ1 and θ2 (i.e., θ1+θ2). This may also be seen from FIG. 16. In FIG. 19, θ1 is the first inclination angle of the light incident surface of the optical fiber adapter 48, i.e., an included angle between the normal line L3 of the light incident surface of the optical fiber adapter 48 and the axis O2 of the optical fiber adapter.

Figure 20:
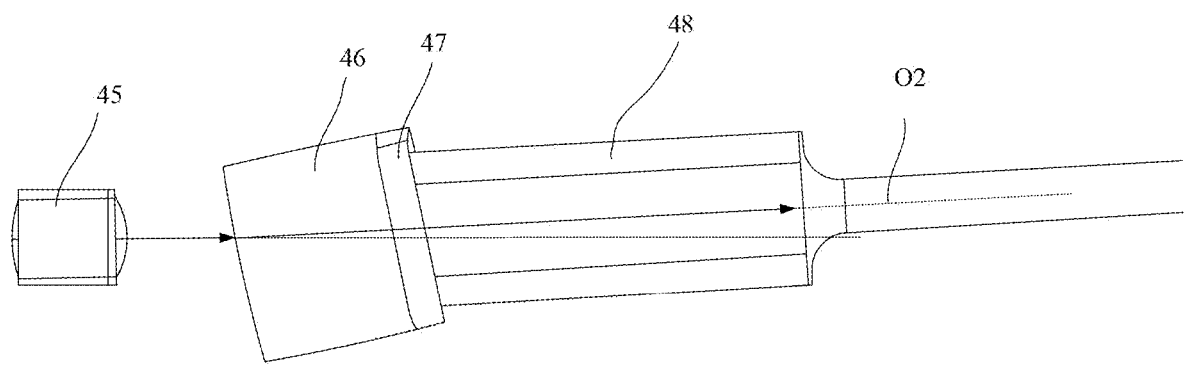
FIG. 20 is a diagram showing another structure of a focusing lens and an optical fiber adapter, in accordance with some embodiments.

FIG. 20 is a diagram showing another structure of a focusing lens and an optical fiber adapter, in accordance with some embodiments. As shown in FIG. 20, through the above arrangement, a direction of the optical axis of the light beams entering the internal optical fiber 49 after refraction may be made parallel or approximately parallel to the axis of the internal optical fiber 49 (the axis being the same as the axis O2 of the optical fiber adapter 48), thereby effectively improving the optical coupling efficiency.

The following will be described by comparing solutions provided in some embodiments of the present disclosure with solutions in comparative embodiments. The light emitted by the laser chip 44 is center-symmetric about the optical axis, and the light entering the internal optical fiber 49 is also center-symmetric about the optical axis, and the light at the optical axis is taken for illustration.

Figure 21A:
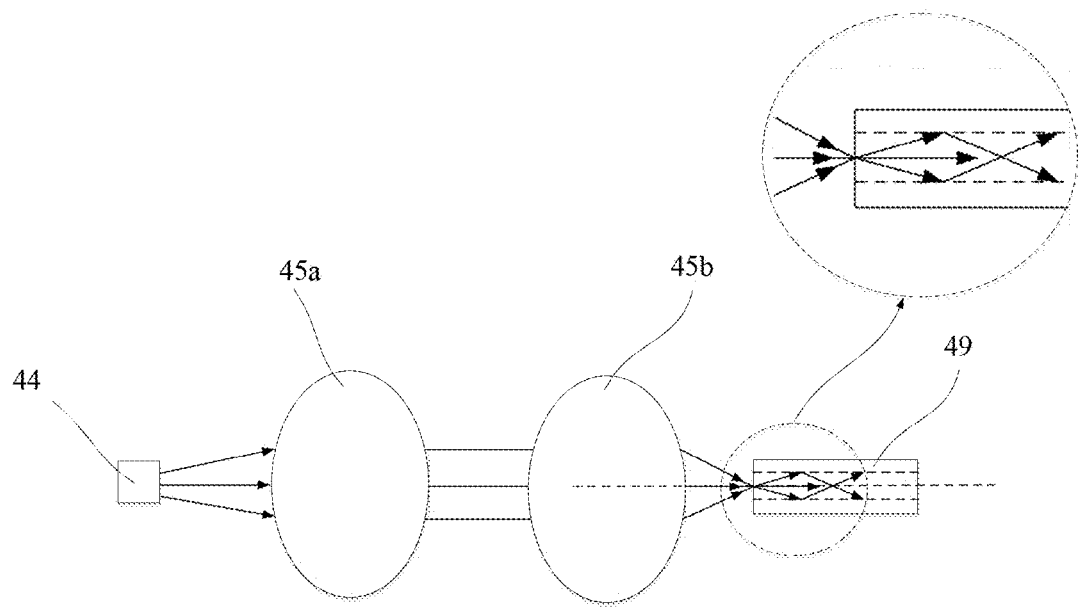
FIG. 21A is a diagram showing an optical path structure of an optical transmitter device, in accordance with comparative embodiments.
Figure 21B:
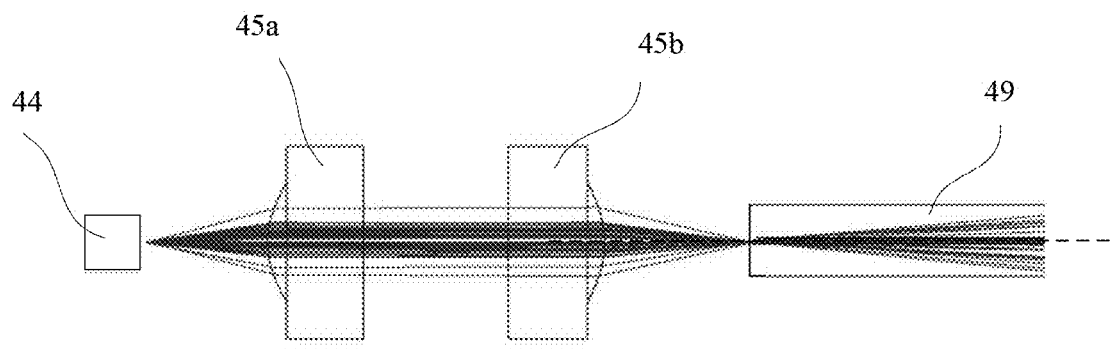
FIG. 21B is a simulation diagram of a coupling efficiency of the optical path structure in FIG. 21A.

FIG. 21A is a diagram showing an optical path structure of an optical transmitter device, in accordance with comparative embodiments. FIG. 21B is a simulation diagram of a coupling efficiency of the optical path structure in FIG. 21A. As shown in FIG. 21A, the focusing lens 45 is composed of a first lens 45a and a second lens 45b, and optical axes of the first lens 45a and the second lens 45b coincide. An optical axis of the light beam emitted by the laser chip 44 coincides with the optical axes of the first lens 45a and the second lens 45b, and the optical axes of the first lens 45a and the second lens 45b coincide with an axis of an optical fiber 49. The light emitted by the laser chip 44 is converged into parallel light by the first lens 45a, and the parallel light is converged by the second lens 45b and then incident on a light incident surface of the optical fiber 49. After the light is converged twice, an original direction of the optical axis of the light is kept, a shape of a light spot is unchanged, and the light spot is a circular light spot in an ideal state. The optical axis of the converged light is perpendicular to the light incident surface of the optical fiber 49. As shown in FIG. 21B, the light is converged through the center of the focusing lens, and the converged light is coupled into the optical fiber 49. Most of the light propagates through the optical fiber 49, so that the optical path structure in FIG. 21A achieves a high coupling efficiency.

In the optical path design adopted in FIG. 21A, the light is refracted at the light incident surface of the optical fiber 49 and then enters the optical fiber 49. Since an optical axis of the light entering the optical fiber 49 is perpendicular to the light incident surface of the optical fiber 49, the direction of the optical axis of the light is unchanged before and after the refraction, and is approximately parallel to the axis of the optical fiber 49, which improves the optical coupling efficiency. In addition, since the light is converged through the center of the focusing lens, the direction of the optical axis of the light before and after the convergence is unchanged, and the shape of the light spot is unchanged, which facilitates the optical coupling. However, light reflected by the light incident surface of the optical fiber 49 returns along the original optical path, which affects the light emission of the laser chip 44.

Therefore, advantages of the optical path design of FIGS. 21A and 21B are that the optical axis of the light entering the optical fiber 49 coincides with the axis of the optical fiber 49, which improves the optical coupling efficiency, and the light is converged by using the center of the focusing lens, which facilitates to maintain a good light spot shape; a disadvantage is that the light reflected by the light incident surface of the optical fiber 49 returns to the laser chip 44 along the original optical path.

Figure 22A:
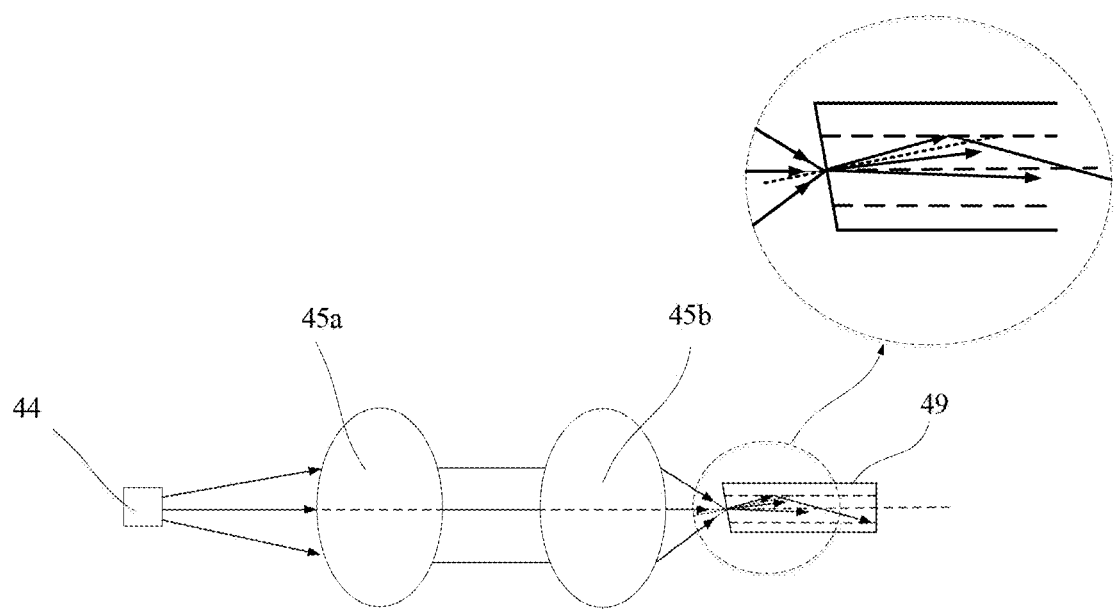
FIG. 22A is a diagram showing another optical path structure of an optical transmitter device, in accordance with comparative embodiments.
Figure 22B:
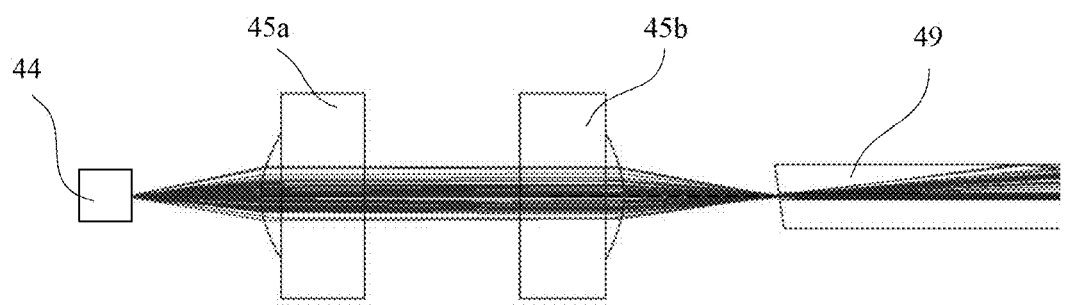
FIG. 22B is a simulation diagram of a coupling efficiency of the optical path structure in FIG. 22A.

FIG. 22A is a diagram showing another optical path structure of an optical transmitter device, in accordance with comparative embodiments. FIG. 22B is a simulation diagram of a coupling efficiency of the optical path structure in FIG. 22A. It will be noted that, an end face of the optical fiber is an inclined surface; in a plan view, a difference in inclined directions of the inclined surface of the optical fiber is only a difference in viewing angles; the optical fiber is a cylinder, and the inclined directions of the inclined surface are different when the optical fiber is rotated. As shown in FIGS. 22A and 22B, the optical axes of the first lens 45a and the second lens 45b coincide. The optical axis of the light beam emitted by the laser chip 44 coincides with the optical axes of the first lens 45a and the second lens 45b, and the optical axes of the first lens 45a and the second lens 45b coincide with the axis of the optical fiber 49. However, unlike FIGS. 21A and 21B, in FIGS. 22A and 22B, the light incident surface of the optical fiber 49 is an inclined surface, and the light emitted by the laser chip 44 is converged by the first lens 45a, and then converged by the second lens 45b and enters the optical fiber 49; the light is converged by a center of the second lens 45b, refracted by the inclined surface of the optical fiber 49, and then coupled into the optical fiber 49. It can be seen that, the optical axis of the light entering the optical fiber 49 does not coincide with the axis of the optical fiber 49, and a large amount of light cannot be totally reflected by the optical fiber 49 and then exit from the optical fiber 49, and the optical coupling efficiency is low.

Therefore, advantages of the optical path design of FIGS. 22A and 22B are that the light reflected by the light incident surface of the optical fiber 49 does not return to the laser chip 44 along the original optical path, and the light is converged by using the center of the focusing lens, which facilitates to maintain a good light spot shape; a disadvantage is that the optical axis of the light entering the optical fiber 49 does not coincide with the axis of the optical fiber 49, which reduces the optical coupling efficiency.

Figure 23A:
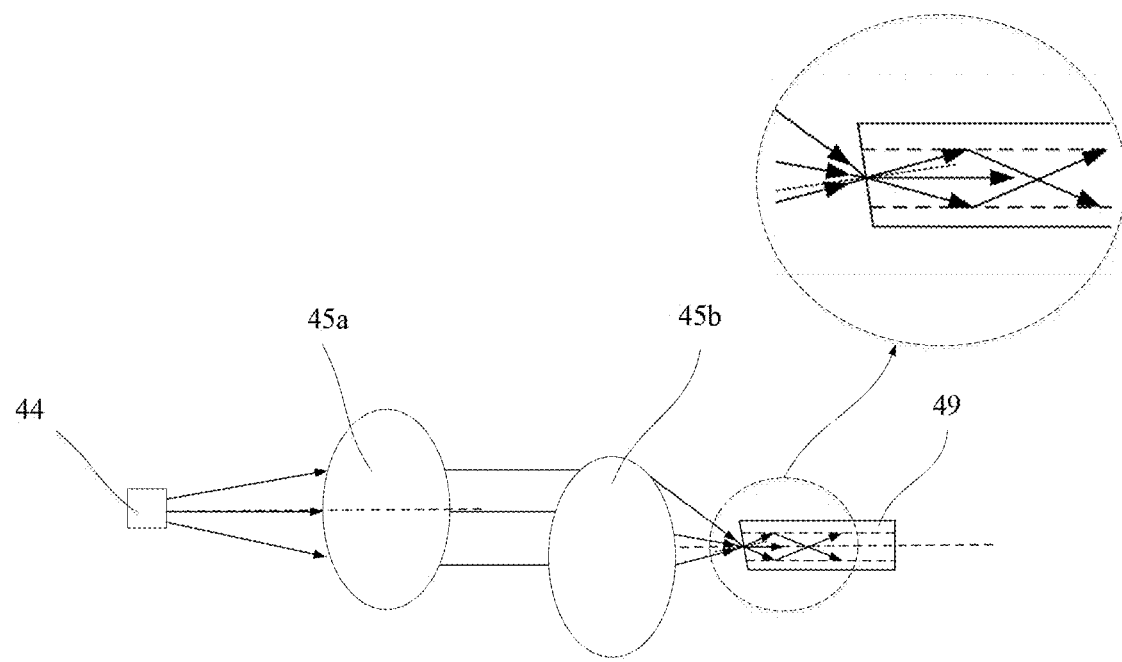
FIG. 23A is a diagram showing yet another optical path structure of an optical transmitter device, in accordance with comparative embodiments.
Figure 23B:
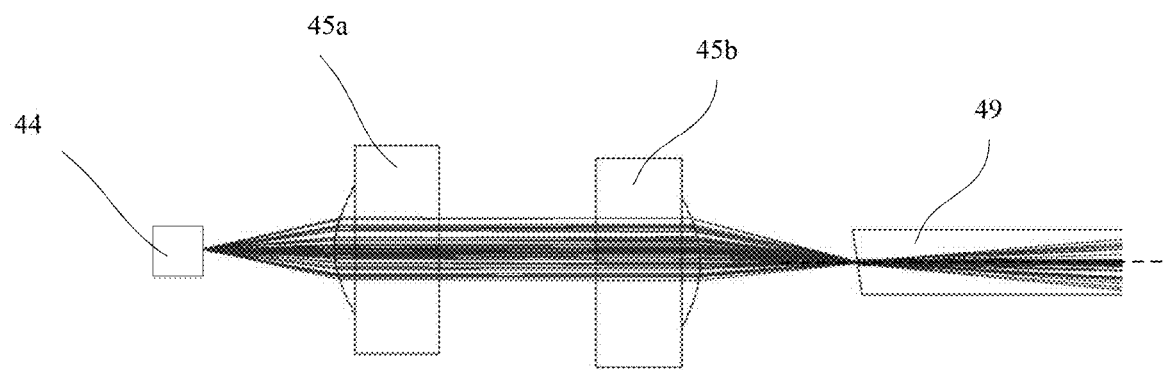
FIG. 23B is a simulation diagram of a coupling efficiency of the optical path structure in FIG. 23A.

FIG. 23A is a diagram showing yet another optical path structure of an optical transmitter device, in accordance with comparative embodiments. FIG. 23B is a simulation diagram of a coupling efficiency of the optical path structure in FIG. 23A. As shown in FIG. 23A, the optical axis of the first lens 45a and the optical axis of the second lens 45b are parallel but do not coincide. The optical axis of the light emitted by the laser chip 44 coincides with the optical axis of the first lens 45a, and the axis of the optical fiber 49 coincides with the optical axis of the second lens 45b. The light emitted by the laser chip 44 is converged into parallel light by the first lens 45a, and the parallel light is converged by the second lens 45b and then incident on the light incident surface of the optical fiber 49. In order to prevent the reflected light from being reversibly reflected back to the laser chip 44, the light incident surface of the optical fiber 49 is an inclined surface. In order to make the optical axis of the light entering the optical fiber 49 approximately parallel to the axis of the optical fiber 49, the light converged by the first lens 45a enters a non-center position of the second lens 45b, and the light is converged through the non-center of the second lens 45b; a direction of an optical axis of the converged light is changed, and the converged light is incident on the light incident surface of the optical fiber 49; the light is refracted at the light incident surface and enters the optical fiber 49.

As shown in FIG. 23A, as in FIG. 22A, the light incident surface of the optical fiber 49 is still an inclined surface, and the axis of the optical fiber 49 is unchanged. However, in order to make the optical axis of the refracted light approximately parallel to the axis of the optical fiber 49 to ensure the optical coupling efficiency, the light emitted by the laser chip 44 cannot propagate in the propagation direction in FIG. 22A. If the light emitted by the laser chip 44 propagates in the propagation direction in FIG. 22A, that is, the light is converged through the center of the focusing lens, and the direction of the optical axis of the light remains unchanged before and after the convergence, then as shown in FIG. 22B, the optical coupling efficiency will be very low.

Therefore, in order to improve the optical coupling efficiency, the propagation direction of the light in FIG. 22A is changed in the solution of FIG. 23A, that is, the direction of the optical axis of the light converged by the second lens 45b is not parallel to the direction of the optical axis of the light emitted by the laser chip 44, so that the optical axis of the light refracted by the light incident surface of the optical fiber 49 is approximately parallel to the axis of the optical fiber 49.

From the simulation diagram in FIG. 23B, it can be seen that the direction of the optical axis of the light converged by the second lens 45b is changed, so that a propagation direction of the converged light is different from the propagation direction in FIG. 22B. In this case, the light is converged through the non-center position of the second lens 45b, thereby improving the optical coupling efficiency.

However, with the optical path design of FIG. 23A, an optical axis of the light converged by the first lens 45a does not pass through the center of the second lens 45b, and a direction of the optical axis of the light is changed after the light passes through the second lens 45b; a light spot incident on the inclined surface of the optical fiber 49 is greatly deformed, a shape of the light spot is distorted, a mode field distribution of the light spot is irregular, and an efficiency of coupling into the optical fiber 49 is significantly reduced.

Advantages of the optical path design of FIGS. 23A and 23B are that the optical axis of the light entering the optical fiber 49 coincides with the axis of the optical fiber 49, which improves the optical coupling efficiency, and the light reflected by the light incident surface of the optical fiber 49 does not return to the laser chip along the original optical path; a disadvantage is that the light is not converged by using the center of the second lens 45b, and the light spot shape after the convergence is greatly deteriorated.

Figure 24A:
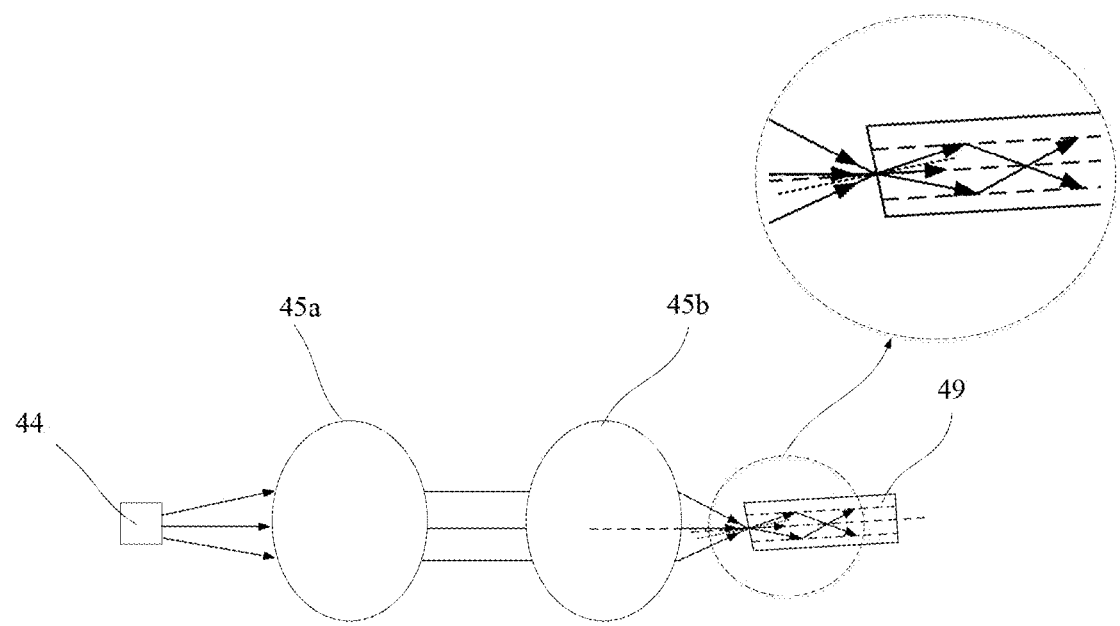
FIG. 24A is a diagram showing an optical path structure of an optical transmitter device, in accordance with some embodiments.
Figure 24B:
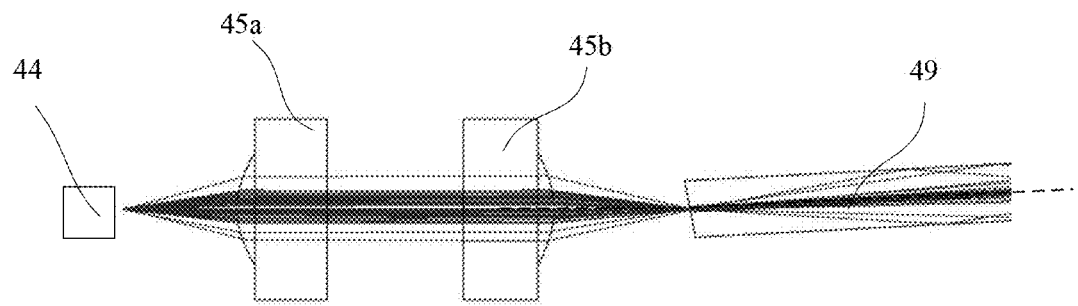
FIG. 24B is a simulation diagram of a coupling efficiency of the optical path structure in FIG. 24A.

FIG. 24A is a diagram showing an optical path structure of an optical transmitter device, in accordance with some embodiments. FIG. 24B is a simulation diagram of a coupling efficiency of the optical path structure in FIG. 24A. As shown in FIG. 24A, for the optical transmitter device 40 provided by some embodiments of the present disclosure, in order to prevent the reflected light from being reversibly reflected back to the laser chip, the light incident surface of the internal optical fiber 49 is an inclined surface, so that the light emitted by the laser chip 44 is incident on the light incident surface of the internal optical fiber 49 in a direction that is not perpendicular to the light incident surface of the internal optical fiber 49.

In addition, in order to maintain a good light spot shape of the light after it is converged, the direction of the optical axis of the light emitted by the laser chip 44 coincides with the optical axis of the focusing lens 45, that is, the light is converged through the center of the focusing lens 45, so that the light passes through the center of the focusing lens 45 and then exits, the direction of the optical axis of the converged light is unchanged, and the converged light retains the light spot shape before the convergence, and the circular light spot shape may be maintained in the ideal state, which facilitates to improve the optical coupling efficiency.

Furthermore, in order to make the direction of the optical axis of the light entering the internal optical fiber 49 after the refraction parallel or approximately parallel to the axis of the internal optical fiber 49, the optical fiber adapter 48 is obliquely disposed on the substrate 41, so that the axis of the internal optical fiber 49 in the optical fiber adapter 48 is not parallel to the light exit direction of the laser chip 44, and in turn, the internal optical fiber 49 is inclined at a certain angle with respect to the light exit direction of the laser chip 44 (e.g., the angle being θ2).

As shown in FIG. 24B, with the optical path structure in FIG. 24A, the light is converged through the center of the second lens 45b, the light incident surface of the internal optical fiber 49 is an inclined surface, and the light converged by the second lens 45b may be efficiently coupled into the internal optical fiber 49, that is, most of the light enters the internal optical fiber 49. Moreover, in FIG. 24A, the axis of the internal optical fiber 49 is not parallel to the light exit direction of the laser chip 44, so that the optical axis of the light entering the internal optical fiber 49 after the refraction is parallel to the axis of the internal optical fiber 49, and in turn, the light is efficiently coupled into the internal optical fiber 49.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the scope of the present disclosure shall be subject to the protection scope of the claims.

What is claimed is:

1. An optical module, comprising:
    a shell;
    a circuit board disposed in the shell and including a signal line and a ground metal wire that are disposed on a surface thereof; and
    an optical transmitter device disposed in the shell, the optical transmitter device including:
        a plate-shaped substrate; and
        a laser assembly disposed on a surface of the substrate, electrically connected to the circuit board, and configured to emit an optical signal; wherein
    the substrate is fixedly connected to an end of the circuit board;
    the laser assembly includes:
        a spacer disposed on the surface of the substrate, and including another signal line and another ground metal wire that are insulated from each other; and
        a laser chip disposed on a surface of the spacer away from the substrate, and configured to emit the optical signal; wherein
    the signal line of the spacer is electrically connected to an anode of the laser chip, and is electrically connected to the signal line of the circuit board; the ground metal wire of the spacer is electrically connected to a cathode of the laser chip, and is electrically connected to the ground metal wire of the circuit board.

2. The optical module according to claim 1, wherein the optical transmitter device further includes a thermoelectric cooler disposed on the surface of the substrate;
    the laser assembly is disposed on a surface of the thermoelectric cooler away from the substrate.

3. The optical module according to claim 2, wherein the optical transmitter device further includes an optical fiber adapter;
    the optical fiber adapter is disposed on the substrate, and is located in a light exit direction of the laser assembly, and is configured to fix an internal optical fiber.

4. The optical module according to claim 3, wherein an end of the optical fiber adapter for insertion of the internal optical fiber is provided to have a tapered structure.

5. The optical module according to claim 3, wherein the substrate includes:
    a recess located in a middle region of the substrate, and configured to accommodate the thermoelectric cooler;
    a first surface located on a side of the recess, and configured to be fixedly connected to a surface of the end of the circuit board; and
    a second surface located on an opposite side of the recess, and configured to bear the optical fiber adapter; wherein
    a surface of the spacer in the laser assembly away from the thermoelectric cooler is in a same plane as a surface of the circuit board on which the signal line and the ground metal wire are disposed.

6. The optical module according to claim 5, wherein the second surface is farther away from a surface of the substrate opposite to the surface where the laser assembly is located than the first surface.

7. The optical module according to claim 5, wherein the optical transmitter device further includes a focusing lens;
   the focusing lens is disposed on the surface of the thermoelectric cooler away from the substrate, and is located between the laser assembly and the optical fiber adapter, so that an optical axis of light emitted by the laser assembly coincides with an optical axis of the focusing lens, thereby converging the light emitted by the laser assembly.

8. The optical module according to claim 7, wherein the optical axis of the focusing lens is in a same plane as an axis of the optical fiber adapter.

9. The optical module according to claim 8, wherein a focus of the focusing lens is located near a light incident surface of an internal optical fiber in the optical fiber adapter.

10. The optical module according to claim 7, wherein a light incident surface of the optical fiber adapter has a first inclination angle with respect to a plane perpendicular to an axis of the optical fiber adapter, and an included angle between a normal line of the light incident surface of the optical fiber adapter and the light exit direction of the laser assembly is equal to the first inclination angle.

11. The optical module according to claim 10, wherein the axis of the optical fiber adapter is in a plane parallel to the second surface, and the axis of the optical fiber adapter has a second inclination angle with respect to the optical axis of the focusing lens;
   in presence of the second inclination angle, the included angle between the normal line of the light incident surface of the optical fiber adapter and the light exit direction of the laser assembly is a sum of the first inclination angle and the second inclination angle.

12. The optical module according to claim 10, wherein the optical transmitter device further includes an isolator;
   the isolator is disposed on the surface of the substrate, and fixedly connected to the light incident surface of the optical fiber adapter, so that an included angle between a normal line of a light incident surface of the isolator and the light exit direction of the laser assembly is the same as the included angle between the normal line of the light incident surface of the optical fiber adapter and the light exit direction of the laser assembly;
   the isolator is configured to prevent the light emitted by the laser assembly from returning to the laser assembly after being reflected by the optical fiber adapter.

13. The optical module according to claim 12, wherein the optical transmitter device further includes an anti-reflection sheet disposed between the isolator and the optical fiber adapter, and the anti-reflection sheet is fixedly connected to both the isolator and the optical fiber adapter.

14. The optical module according to claim 1, wherein a surface of the substrate opposite to the surface where the laser assembly is located is fixed to the shell, and the circuit board is close to the surface of the substrate on which the laser assembly is disposed.

15. The optical module according to claim 14, wherein the circuit board includes a first portion and a second portion, the first portion is a portion of the circuit board matched with the optical transmitter device, and the second portion is a remaining portion of the circuit board;
   the second portion is configured to be fixedly connected to the substrate, and includes a recess portion in which the optical transmitter device is disposed, so that the optical transmitter device is not blocked by the circuit board.

16. The optical module according to claim 14, further comprising a wire bonding protection component;
   the wire bonding protection component is disposed on a surface of the circuit board away from the substrate, and is located at an end of the circuit board close to the laser assembly, so that connecting lines connecting the laser assembly and the circuit board are covered by the wire bonding protection component.

17. The optical module according to claim 16, wherein the wire bonding protection component includes:
   a protection plate; and
   a plurality of supports, one end of each support being fixedly connected to the protection plate, and another end of each support being fixedly connected to the surface of the circuit board away from the substrate.

18. The optical module according to claim 16, further comprising a laser driver chip; wherein
   the laser driver chip is disposed on the surface of the circuit board away from the substrate, and is configured to transmit a modulation signal to the laser assembly, so that the laser assembly emits an optical signal based on the modulation signal;
   the wire bonding protection component covers the laser driver chip.

19. The optical module according to claim 16, wherein the wire bonding protection component is made of a non-metallic material, and is fixedly connected to the circuit board through a non-conductive adhesive.

\* \* \* \* \*